US008280075B2

(12) United States Patent
Asada et al.

(10) Patent No.: US 8,280,075 B2
(45) Date of Patent: Oct. 2, 2012

(54) APPARATUS, METHOD AND PROGRAM FOR PROCESSING SIGNAL AND METHOD FOR GENERATING SIGNAL

(75) Inventors: Kohei Asada, Kanagawa (JP); Tetsunori Itabashi, Kanagawa (JP); Kenji Nakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 1277 days.

(21) Appl. No.: 12/012,534

(22) Filed: Feb. 4, 2008

(65) Prior Publication Data

US 2008/0189065 A1 Aug. 7, 2008

(30) Foreign Application Priority Data

Feb. 5, 2007 (JP) ................................ 2007-025921

(51) Int. Cl.
*H03G 5/00* (2006.01)

(52) U.S. Cl. .......................... 381/98; 381/103; 708/300

(58) Field of Classification Search .................... 700/94; 708/300, 322, 323, 402–405; 381/103, 98, 381/59, 96, 94.1–94.3; 702/76, 77, 78
See application file for complete search history.

(56) References Cited

U.S. PATENT DOCUMENTS

| | | | | |
|---|---|---|---|---|
| 7,746,964 | B2 * | 6/2010 | Nakano | 375/345 |
| 2004/0146170 | A1 | 7/2004 | Zint | |
| 2006/0153391 | A1 | 7/2006 | Hooley et al. | |
| 2007/0133823 | A1 | 6/2007 | Nakano | |
| 2007/0230556 | A1 | 10/2007 | Nakano | |
| 2008/0260170 | A1 | 10/2008 | Nakano | |

FOREIGN PATENT DOCUMENTS

| | | | |
|---|---|---|---|
| EP | 0119645 | A | 9/1984 |
| EP | 0898364 | A | 2/1999 |
| EP | 1786241 | A2 | 5/2007 |
| JP | 58-202619 | A | 11/1983 |
| JP | 03-006467 | | 1/1991 |
| JP | 05-327656 | A | 12/1993 |
| JP | 08-047079 | A | 2/1996 |
| JP | 08-248077 | A | 9/1996 |
| JP | 08-292179 | A | 11/1996 |
| JP | 11-112254 | A | 4/1999 |
| JP | 2000-097762 | A | 4/2000 |

(Continued)

OTHER PUBLICATIONS

Mueller, Swen et al.: "Transfer-Function Measurement with Sweeps," Journal of the Audio Engineering Society, Audio Engineering Society, Jun. 2001, pp. 443-471, vol. 49, No. 6, New York, New York.

(Continued)

*Primary Examiner* — Xu Mei
(74) *Attorney, Agent, or Firm* — Wolf, Greenfield & Sacks, P.C.

(57) ABSTRACT

A signal processing apparatus includes a signal output unit for outputting a measurement signal, the measurement signal being produced by synthesizing a signal composed of a concatenation of $2^d$ period signals with a sinusoidal signal, each period signal having a time-domain waveform period being $2^n$ samples, the sinusoidal wave having a wave count within the concatenation period of $2^d$ period signals being other than an integer multiple of $2^d$, and n and d being respectively natural numbers, and an analyzing unit for frequency analyzing a response signal obtained as a result of picking up the measurement signal output from the signal output unit.

11 Claims, 21 Drawing Sheets

FOREIGN PATENT DOCUMENTS

| | | | |
|---|---|---|---|
| JP | 2001-025100 | A | 1/2001 |
| JP | 2001-212100 | A | 8/2001 |
| JP | 2001-212101 | A | 8/2001 |
| JP | 2001-217665 | A | 8/2001 |
| JP | 2002-354599 | A | 12/2002 |
| JP | 2004-007245 | A | 1/2004 |
| JP | 2005-175562 | A | 6/2005 |
| JP | 2006-005902 | A | 1/2006 |
| JP | 2006-516373 | A | 6/2006 |
| WO | WO 2007/078254 | | 7/2007 |

OTHER PUBLICATIONS

Small, Richard H.: "Measurement of Loudspeaker Amplitude Modulation Distorsion," 114th Convention of the Audio Engineering Society, Mar. 2003, pp. 1-8, Amsterdam, The Netherlands.

* cited by examiner

APPARATUS, METHOD AND PROGRAM FOR PROCESSING SIGNAL AND METHOD FOR GENERATING SIGNAL

CROSS REFERENCES TO RELATED APPLICATIONS

The present invention contains subject matter related to Japanese Patent Application JP 2007-025921 filed in the Japanese Patent Office on Feb. 5, 2007, the entire contents of which are incorporated herein by reference.

BACKGROUND OF THE INVENTION

1. Field of the Invention

The present invention relates to a signal processing apparatus and a signal process method for performing at least a frequency analysis on a response signal obtained as a result of outputting a measurement signal in a system for measurement. The present invention further relates to a computer program executed in such signal processing apparatus, and a signal generation method of generating a measurement signal.

2. Description of the Related Art

In audio systems of related art for reproducing and outputting an audio signal, a measurement signal such as a time stretched pulse (TSP) is emitted from a loudspeaker and then picked up by a microphone. Based on such pickup sounds, frequency-amplitude characteristics and travel time between loudspeaker and microphone in a system are measured.

The TSP signal is generated to satisfy at least the following conditions. Let "N" represent the number of samples of a signal and "Fs" represent a sampling frequency (operation clock frequency), and a signal ranging from 0 Hz to Fs/2 Hz is contained in steps of Fs/N Hz at the same gain level.

For example, given the sampling frequency Fs=48 kHz and the number of samples N=4096, a signal ranging from 0 Hz to 24 (48/2) kHz is contained in steps of about 11.7 (48000/4096) Hz on the frequency domain at the same gain level.

If a signal satisfying only this condition is output in a wave in the time domain as a measurement signal, that signal has a very short duration of time and a low energy level. In the measurement signal generally called TSP signal, a predetermined frequency component of the measurement signal is phase-rotated depending on frequency. With the phase rotation performed, and the signal as a time-domain wave has energy spread in the time domain.

On the other hand, a phase-rotated signal tends to become small in the amplitude thereof. The phase-rotated signal is thus increased in gain (volume) to a level required for measurement.

OA-TSP (optimized Aoshima's TSP) signal is well known as one example of TSP (as described in Japanese Unexamined Patent Application Publication No. 3-6467). A signal satisfying the following equations (1) and (2) in the frequency domain is inverse Fourier transformed to be time-domain waveform.

$$H(n)=a_0\cdot\exp(j4m\pi n^2/N^2),\ 0\leqq n\leqq N/2 \quad (1)$$

(m and n: integers)

$$H(n)=H^*(N-n),\ N/2+1\leqq n\leqq N-1 \quad (2)$$

(n: integer and *: conjugate)

FIG. 20 illustrates an OA-TSP signal with the number of samples N=4069 and m=2048. As shown in FIG. 20, the amplitude of the signal is normalized to 1.0.

The TSP signal of FIG. 20 is emitted from a loudspeaker and the emitted sound is then picked up by a microphone.

Based on the collected sound, acoustic characteristics such as frequency-amplitude characteristics and travel time between the loudspeaker and the microphone are measured.

In order to increase a signal-to-noise (S/N) ratio in such an acoustic measurement, the TSP signal is periodically reproduced and the response waveform of the TSP signal is synchronization addition/averaged by a unit of period (equal to 4096 samples) in a general practice.

Frequency-amplitude characteristics are obtained by frequency analyzing the measured TSP response signal using fast Fourier transform (FFT). The frequency-amplitude characteristics include a combination of transfer functions Hsp, Haco and Hmic of a loudspeaker, measurement space and a microphone.

The linear or periodical convolution of the response signal and an inverse filter (inverse TSP signal) defined by the following equations (3) and (4) (representing conditions in the frequency domain) results in accurate phase information of a transfer function. The impulse response is determined by performing inverse fast Fourier transform (IFFT) on the signal and the inverse filter to return the signal to a time domain signal.

$$H^{-1}(n)=(1/a_0)\cdot\exp(-j4m\pi n^2/N^2),\ 0\leqq n\leqq N/2 \quad (3)$$

$$H^{-1}(n)=H^*(N-n),\ N/2+1\leqq n\leqq N-1 \quad (4)$$

One example of resulting impulse response is shown in FIG. 21 for reference purposes only.

By analyzing the impulse response, the travel time between the loudspeaker and the microphone is measured.

In the audio system, the acoustic measurement result thus obtained is accurately used in sound field correction function.

More specifically, the frequency-amplitude characteristics (also simply referred to as frequency characteristics) are used as an evaluation indicator for use in adjusting an equalizer so that current characteristics becomes flat in the frequency domain (or becomes any frequency curve).

Gain information in an environment can be calculated from the frequency-amplitude characteristics. The term gain contains information relating to the efficiency of the loudspeaker and sound absorption and reflection characteristics of walls, and is typically calculated from an average level of a particular band for an intended purpose of the frequency characteristics.

A recommendation for the use of a bass management system is presented or the bass management system is automatically set. In the bass management system, low-frequency reproduction performance of the loudspeaker in use is analyzed and determined from the frequency characteristics and a low-frequency signal of a source content is sent to a subwoofer.

Information regarding the distance between the loudspeaker and the microphone is obtained from information regarding sound travel time between the loudspeaker and the microphone acquired from the impulse response. Delay time adjustment (time alignment) can be performed on the sound emitted from the loudspeaker based on the distance information.

Variations in the performances of the loudspeakers installed in room space, variations in the distance to the position of a listener (microphone position) and variations in the environment (such as closeness to walls and the presence of obstacles) are corrected in the sound field correction process based on the acoustic measurement. In this way, the process allows the user to listen to a correct sound image as a creator of each content intends.

The audio system automatically performs the sound correction process in response to a user operation input. Such an automatic sound correction function is an extremely effective function because it is complicated and difficult for the user to set and modify manually a variety of parameters, particularly in a multi-channel system having a plurality of loudspeakers and it is difficult to prepare a plurality of loudspeakers having the same characteristics.

The sound correction requires that the measurement signal (response signal) be frequency-analyzed to acquire the frequency-amplitude characteristics. The problem of frequency resolution in the frequency analysis during the acoustic measurement has been pointed out.

FIG. 22 illustrates frequency analysis results obtained from the TSP signal having the number of samples N=4096 and the sampling frequency Fs=48 kHz. As shown in FIG. 22, the abscissa represents frequency (Hz) and the ordinate represents gain (dB).

As previously discussed, given the number of samples N=4096 and the sampling frequency Fs=48 kHz, the frequency resolution in the frequency analysis results is 11.7 Hz from Fs/N=48000/4096.

The frequency resolution is 11.7 Hz over the entire range. In accordance with the human auditory sense, the frequency axis is logarithmically represented as shown in FIG. 22. In medium to high frequency regions labeled the letter “B,” the frequency resolution becomes higher. On the other hand, the low frequency region labeled the letter “B,” the frequency resolution becomes lower.

Several multi-channel systems having a sub-woofer use the bass management system in the low frequency region. The lower the frequency, the lower the frequency resolution becomes. It may be difficult to determine appropriately whether to send a signal to the sub-woofer. The sound correction cannot be performed in a proper manner.

The frequency resolution is represented by Fs/N as previously discussed. An increase in the value N, namely, in the number of samples in the time domain of the TSP signal increases the frequency resolution. For example, if the number of samples N is doubled as 4096×2=8192, the frequency resolution becomes 5.85 Hz from 48000/8192.

SUMMARY OF THE INVENTION

The frequency resolution is improved by adopting a technique of increasing the number of samples N of the TSP signal.

The number of samples N is a power of 2. To double the frequency resolution, the number of samples needs to be increased to 8192 samples and to quadruple the frequency resolution, the number of samples needs to be increased to 16384. Such an increase in the number of samples also leads to an increase in the memory capacity required for frequency analysis and workload in fast Fourier transform (FFT) process.

A reduction in the frequency resolution in the low frequency region is particularly problematic in the above-described bass management process. The technique of increasing the frequency resolution with an increase in the number of samples N results in an increase over the entire frequency range. As previously discussed, if a frequency resolution of 11.7 Hz or so is sufficient in the medium to high frequency regions, the increase of the frequency resolution over the entire range is unnecessary, inefficient and not preferable.

In accordance with one embodiment of the present invention, a signal processing apparatus includes a signal output unit for outputting a measurement signal, the measurement signal being produced by synthesizing a signal composed of a concatenation of $2^d$ period signals with a sinusoidal signal, each period signal having a time-domain waveform period being $2^n$ samples, the sinusoidal wave having a wave count within the concatenation period of $2^d$ period signals being other than an integer multiple of $2^d$, and n and d being respectively natural numbers, and an analyzing unit for frequency analyzing a response signal obtained as a result of picking up the measurement signal output from the signal output unit.

In accordance with one embodiment of the present invention, a method of generating a signal, includes a step of generating a measurement signal, the measurement signal being produced by synthesizing a signal composed of a concatenation of $2^d$ period signals with a sinusoidal signal, each period signal having a time-domain waveform period being $2^n$ samples, the sinusoidal wave having a wave count within the concatenation period of $2^d$ period signals being other than an integer multiple of $2^d$, and n and d being respectively natural numbers.

If the sinusoidal wave having a wave count within the concatenation period of $2^d$ period signals being other than an integer multiple of $2^d$ is synthesized with the signal containing a concatenation of $2^d$ period signals, the measurement signal contains a sinusoidal wave component of a medium period.

For example, a TSP signal of 4096 samples with n=12 is considered as a period signal of $2^n$ samples. The TSP signal contains a sinusoidal wave component of an integer period within one period.

For example, $2^1$ TSP signals are concatenated with d=1. A sinusoidal wave having the wave count being other than an integer multiple of $2^1$ within a concatenation period of two (4096×2=8192) is synthesized with the concatenated two TSP signals.

In the sinusoidal wave having the wave count being other than an integer multiple of $2^1$, namely, an odd number within the period of two TSP signals, the wave count is not an integer but a value between integers with respect to half samples, namely, 4096 samples. Only a sinusoidal wave having an integer period is contained in the TSP signal of 4096 samples. The measurement signal having the sinusoidal wave synthesized thereinto contains a sinusoidal wave component having a medium period with respect to a sinusoidal wave component having an integer period obtained from the TSP signal only.

Frequency analysis is performed on such a measurement signal in accordance with embodiments of the present invention. With this arrangement, frequency analysis is performed on the thus synthesized sinusoidal wave component having a wave count between the integers, and frequency resolution is increased.

With the measurement signal of embodiments of the present invention, synthesis of only the sinusoidal wave having a period responsive to a frequency of a band sought to be improved is sufficient to increase the frequency resolution. During analysis, it is sufficient enough to analyze additionally the synthesized sinusoidal wave component.

The embodiments of the present invention are free from the problems in the related art such as a memory capacity and calculation amount doubled or quadrupled as a result of mere increase in the number of samples of the measurement signal. The degree of increase in the memory capacity and calculation amount is substantially reduced.

In accordance with embodiments of the present invention, it is sufficient if only the sinusoidal wave in the period responsive to the frequency band sought to be increased in resolution is synthesized. During analysis, only the synthesized sinusoidal wave is analyzed. In comparison with the related art in which the number of samples of the measurement signal is increased to increase the frequency resolution, an increase in the required memory capacity and an increase in the amount of calculation for analysis are substantially reduced.

DESCRIPTION OF THE PREFERRED EMBODIMENTS

The embodiments of the present invention are described below.

Figure 1:
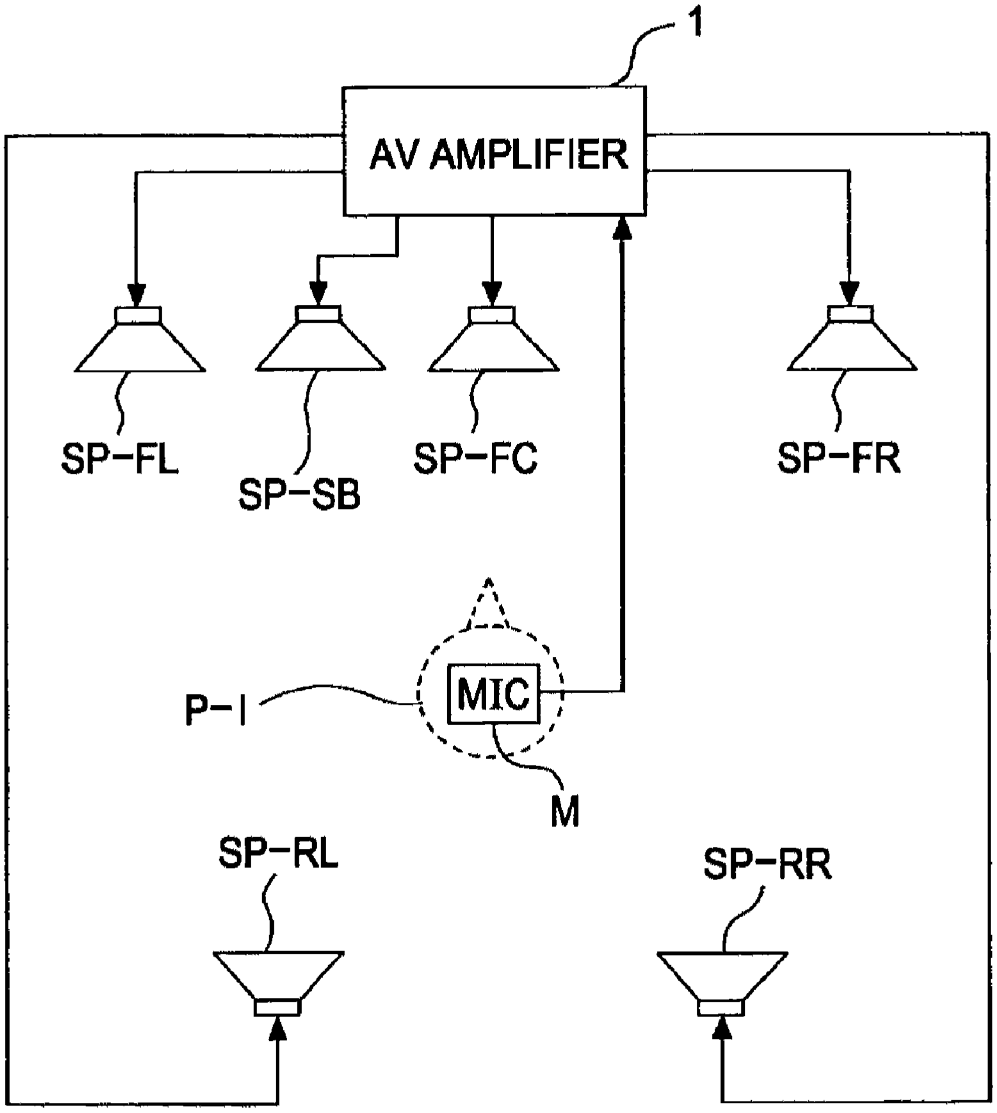
FIG. 1 illustrates an AV system including an AV amplifier in accordance with one embodiment of the present invention.

FIG. 1 illustrates an AV system including an AV amplifier 1 including a signal processing apparatus in accordance with one embodiment of the present invention.

As shown in FIG. 1, the AV system is a 5.1 ch surround system. As shown, the AV amplifier 1 connects to a total of six loudspeakers including 5 channel loudspeakers including a front center loudspeaker SP-FC, a front right loudspeaker SP-FR, a front left loudspeaker SP-FL, a rear right loudspeaker SP-RR and a rear left loudspeaker SP-RL and a sub-woofer SP-SB.

A microphone M for acoustic measurement is set up at a listening position P-1. The microphone M is also connected to the AV amplifier 1.

In response to an audio signal (sound signal) input from the outside, the AV amplifier 1 supplies respective audio signals to the loudspeakers SP, emitting sounds from the loudspeakers.

The AV amplifier 1 has a automatic sound field correction function to adjust automatically an equalizer in response to analysis results of the frequency-amplitude characteristics, and perform time alignment process based on the travel time between the loudspeakers SP and the microphone M and various sound field correction processes.

Figure 2:
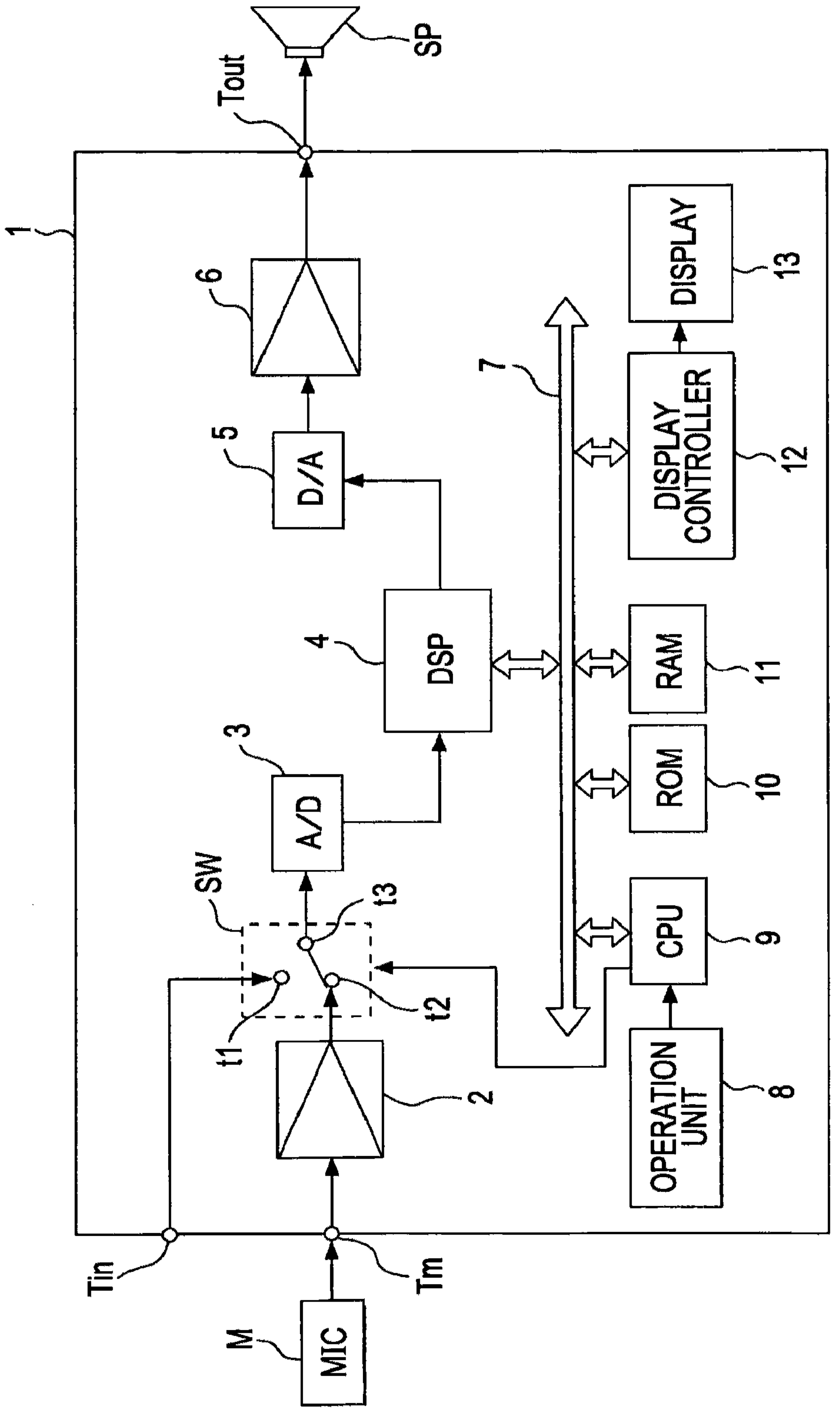
FIG. 2 is a block diagram illustrating the AV amplifier including a signal processing apparatus in accordance with one embodiment of the present invention.

FIG. 2 is a block diagram illustrating of the AV amplifier 1 of FIG. 1.

As shown in FIG. 2, a total of six loudspeakers SP (SP-FC, SP-FR, SP-FL, SP-RR, SP-RL and SP-SB) are illustrated as a single loudspeaker for convenience of explanation.

The loudspeaker SP is connected to a speaker output terminal Tout in the AV amplifier 1 as shown in FIG. 2.

The microphone M of FIG. 1 is connected to a microphone input terminal Tm.

In addition to the microphone input terminal Tm, the AV amplifier 1 further includes an audio input terminal Tin that receives an audio signal from the outside.

A switch SW is used to switch input signals. The switch SW is arranged to switch between a terminal t1 and a terminal t2 to be connected to a terminal t3. The terminal t1 connects to the audio input terminal Tin and the terminal t2 receives an input signal from the microphone input terminal Tm after being amplified through an amplifier 2. The terminal t3 is connected to an analog-to-digital (A/D) converter 3.

With the terminal t1 selected in the switch SW, the input signal input from the outside via the audio input terminal Tin is supplied the A/D converter 3. With the terminal t2 selected in the switch SW, the input signal input from the microphone M via the microphone input terminal Tm is supplied to the A/D converter 3.

A central processing unit (CPU) 9 controls the switch SW.

The A/D converter 3 analog-to-digital converts the input signal from the switch SW. An audio signal, analog-to-digital converted by the A/D converter 3, is input to a digital signal processor (DSP) 4.

The DSP 4 performs measurements, analysis process and audio signal process on the input audio signal.

In particular, the DSP 4 measures acoustic characteristics required for automatic sound field correction such as the frequency-amplitude characteristics and the travel time between the loudspeaker SP and the microphone M. The acoustic characteristics are measured by outputting a measurement signal from the loudspeaker SP and picking up the measurement signal emitted from the loudspeaker SP using the microphone M.

Measurement operation of the acoustic characteristics is performed by the DSP 4 in response to a command from the CPU 9. The measurement operation and the structure of the DSP 4 performing the measurement operation will be described later.

The DSP 4 corrects the frequency-amplitude characteristics, and performs a bass management process and a time alignment process based on the measurement results of the acoustic characteristics.

Based on the analysis results of the frequency-amplitude characteristics obtained from the measurement operation, the frequency-amplitude characteristics are set to be flat in the frequency domain (or to any frequency curve) using an equalizer to adjust gain on a per frequency band basis.

In the bass management process, the low-frequency reproducing performance of the loudspeakers SP other than the sub-woofer SP-SB is determined based on a detail analysis of the low-frequency region of the frequency-amplitude characteristics and if a corresponding loudspeaker is determined to be unable reproduce a low-frequency signal, the low-frequency signal is transferred to the sub-woofer SP-SB. Alternatively, if one loudspeaker is determined to be unable to reproduce the low-frequency signal, an instruction may be issued to command the CPU 9 to display on a display screen a message prompting a user to supply the low-frequency signal to the sub-woofer SP-SB.

In the time alignment process, information regarding the distance between each loudspeaker and the microphone M is obtained from the measurement results of the travel time between each loudspeaker and the microphone M. A delay time adjustment is performed in the audio signal output for each loudspeaker based on the distance information.

The sound field correction process performed based on the acoustic measurement results thus corrects variations in the efficiencies of the loudspeakers SP installed in the room, variations in the distance to the listener's position (microphone position) and variations in the environment (closeness to walls and the presence of an obstacle). The user can thus enjoy a correct sound image intended by a content creator.

The audio signal processed by the DSP 4 is digital-to-analog converted by a digital-to-analog (D/A) converter 5 and then amplified by an amplifier 6. The amplified signal is supplied to the speaker output terminal Tout and the corresponding sound is then emitted from the loudspeaker SP.

As shown in FIG. 2, the CPU 9 working with a read-only memory (ROM) 10 and a random-access memory (RAM) 11 generally controls the AV amplifier 1.

As shown in FIG. 2, the CPU 9 is connected to the DSP 4, the ROM 10, the RAM 11 and a display controller 12.

The ROM 10 stores an operating program and a variety of coefficients. The RAM 11 serves as a working area for the CPU 9.

The CPU 9 connects to an operation unit 8.

The operation unit 8 includes a variety of controls arranged to be exposed outside the casing of the AV amplifier 1 and outputs to the CPU 9 an operation signal responsive to a user operation. The CPU 9 controls each element in response to the operation signal from the operation unit 8. The AV amplifier 1 operates in response to the operation signal input by the user.

The operation unit 8 may include a command receiver receiving a command signal such as an infrared signal transmitted from a remote commander. More specifically, the operation unit 8 working as a command receiver receives a command signal transmitted from the remote commander in response to the user operation and supplies the received command signal to the CPU 9.

The display controller 12 under the control of the CPU 9 controls and drives a display 13. The display 13 is a display device such as a liquid-crystal display (LCD). The display controller 12 controls and drives the display 13 in response to display data supplied from the CPU 9.

FIG. 2 illustrates only one example of the AV amplifier 1 and the present invention is not limited to the AV amplifier 1. For example, the audio input terminal Tin is not limited to an analog input terminal and may include a digital audio input terminal such as Sony/Philips digital interface format (S/PDIF) terminal. In such a case, the 5.1 ch multi-channel audio signal may be directly input to the DSP 4 via the S/PDIF terminal.

A plurality of lines of audio input terminals Tin may be arranged. The audio input terminals Tin may function as a selector selecting one of the plurality of input lines.

A plurality of pairs of audio input terminal and video input terminal for receiving the audio signal and video signal to be output in synchronization may be arranged with one line of video output terminal added. Only selected audio signal and video signal are then output from a speaker output terminal and a video output terminal. In other words, such a terminal system may function as a selector for the audio signal and the video signal.

A terminal receiving audio and video signals to be output in synchronization may include a high-definition multimedia interface (HDMI).

An upconvert function of the video signal may be provided to the terminal so that the number of scanning lines is increased or interlace to progressive conversion output is performed.

The AV amplifier 1 of FIG. 2 has the sound field correction function such as the frequency-amplitude characteristics correction and the time alignment process. To perform the sound field correction, the acoustic characteristics such as the frequency-amplitude characteristics and the travel time between the loudspeakers SP and the microphone M are measured.

Figure 22:
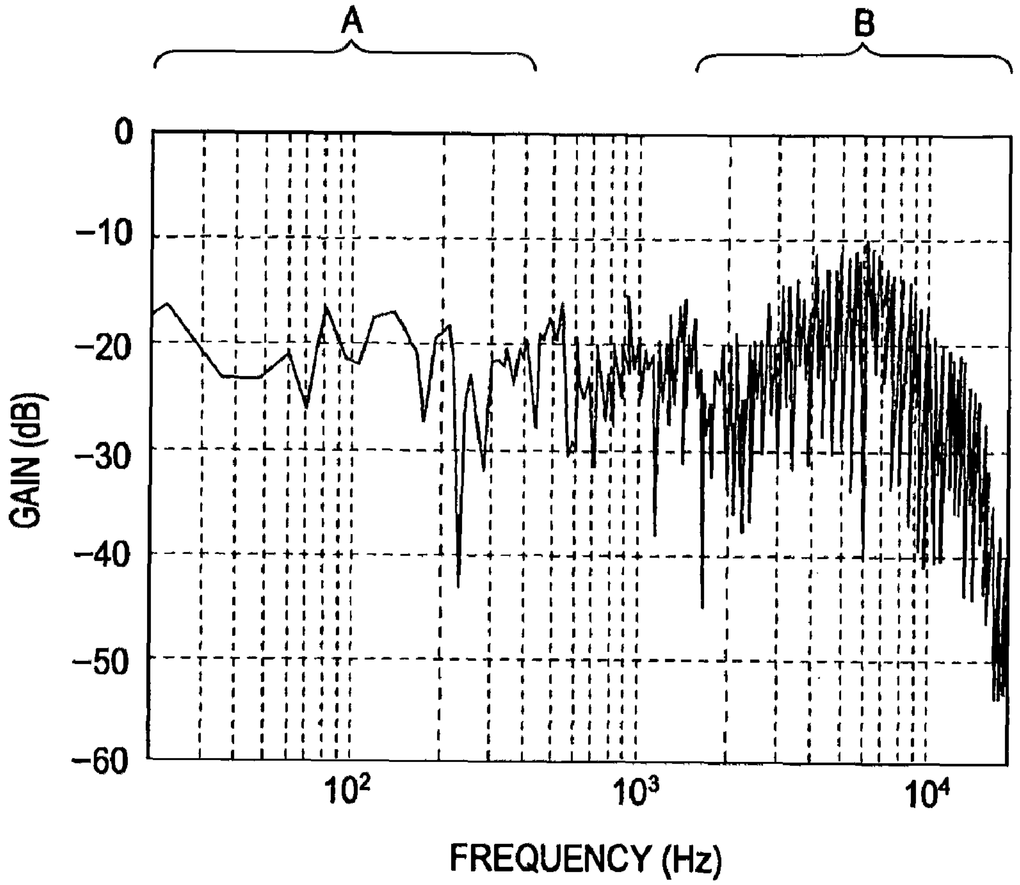
FIG. 22 illustrates frequency analysis results with the number of samples of the TSP signal N=4096 and the sampling frequency of the TSP signal Fs=48 kHz.

As previously discussed, the time-stretched pulse (TSP) signal has been used as the measurement signal in the acoustic measurement. If the TSP signal is used as the measurement signal, a drop in the frequency resolution in the low-frequency region becomes problematic in the auditory sense (FIG. 22).

Depending on the drop in the frequency resolution in the low-frequency region, the system performing the bass management process cannot determine from the frequency analysis results whether to transfer the low-frequency signal to the sub-woofer SP-SB. More specifically, if the determination of the system is inappropriate, the low-frequency signal that should not be output to the sub-woofer SP-SB happens to be output to the sub-woofer SP-SB. As a result, sound field reproducing performance may be degraded, and an appropriate sound correction cannot be performed.

The drop in the frequency resolution is overcome by increasing the number of samples N of the TSP signal. Let N represent the number of samples of the TSP signal and Fs represent the sampling frequency (operating clock frequency) of the DSP 4, and the frequency resolution is represented by Fs/N. The frequency resolution can thus be increased by increasing the number of samples N.

The number of samples N is a power of 2. If the frequency resolution is heightened by increasing the number of samples N, the number of samples N needs to be increased in steps of a power of 2. For example, the frequency resolution is now 11.7 Hz with the sampling frequency Fs=48 kHz and the number of samples N=4096. To double the frequency resolution, the number of samples N also should be doubled to 8192. To quadruple the frequency resolution, the number of samples N should be quadrupled to 16384.

The use of the technique of increasing the number of samples N leads to an increase in the memory capacity for frequency analysis and an increase in the process workload for the fast Fourier transform (FFT).

Where the bass management process is concerned, a drop in the frequency resolution on the low-frequency region is a problem. The technique of heightening the frequency resolution by increasing the number of samples N heightens the frequency resolution over the whole range of the audio signal. A frequency resolution of 11.7 Hz obtained with the number of samples N=4096 is sufficient on the medium to high frequency range. The increase in the frequency resolution over the whole range is useless and even not preferable.

A new measurement method is thus proposed here in view of the above problem.

Before the description of the measurement signal, a TSP signal used in the related art is considered again.

The widely used TSP signal is known as the OA-TSP signal. The OA-TSP signal has been discussed with reference to equations (1) and (2).

In accordance with the TSP signal in the related art, a required phase rotation and gain increase are performed so that energy is spread in the time domain. A modest level of S/N ratio is achieved in this way.

The environment in which the acoustic measurement is performed using the TSP signal may be home, and a background noise becomes problematic in such an environment.

The typical background noise is known to be at a high level on the low-frequency region. In this way, a pickup signal has a low S/N ratio particularly on the low-frequency region.

As a step to overcome the background noise, the number of reproduction of the TSP signal (i.e., the number of average operations of the response signal) may be increased or the reproduction volume level of the TSP signal may be raised. The former technique leads to a longer period of time for the acoustic measurement, and the latter technique leads to a risk of breakdown of the loudspeaker SP or a noisy sound to neighbors if the loudspeaker SP is not broken. Both techniques inconvenience the user.

In accordance with the present embodiment, a measurement signal is generated based on a signal improved from the TSP signal (OA-TSP signal) used in the related art in view of a step to overcome the background noise.

An original base signal is defined as below. Let N represent the number of samples and Fs represent the sampling frequency (operating clock frequency), a signal ranging from 0 Hz to Fs/2 is contained at the same gain level in steps of Fs/H Hz. For example, when the number of samples N of the base signal is 4096 and the sampling frequency (operating clock frequency of the DSP 4) Fs is 48 kHz, the base signal contains a signal ranging from 0 Hz to 24 (48/2) kHz at the same gain level in steps of about 11.7 (48000/4096) Hz in the frequency domain.

The phase rotation and gain increase process is performed on the base signal as in the widely accepted practice. An amplitude curve having characteristics of FIGS. 3A and 3B are imparted to the base signal as a step to overcome the background noise.

Figure 3A:
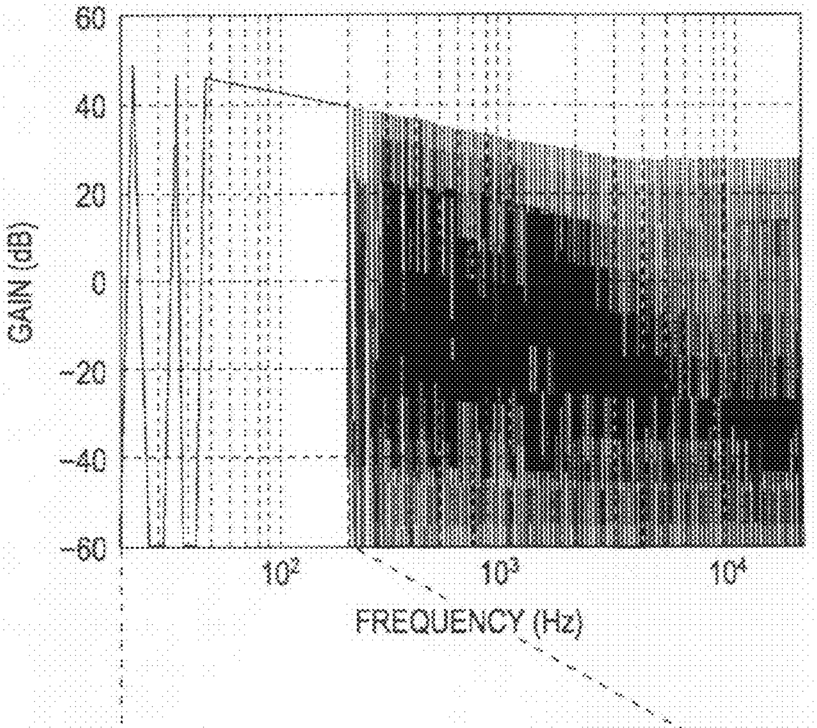
FIGS. 3A and 3B illustrate amplitude curve characteristics (gain characteristics) imparted to a base signal of a measurement signal in accordance with one embodiment of the present invention.
Figure 3B:
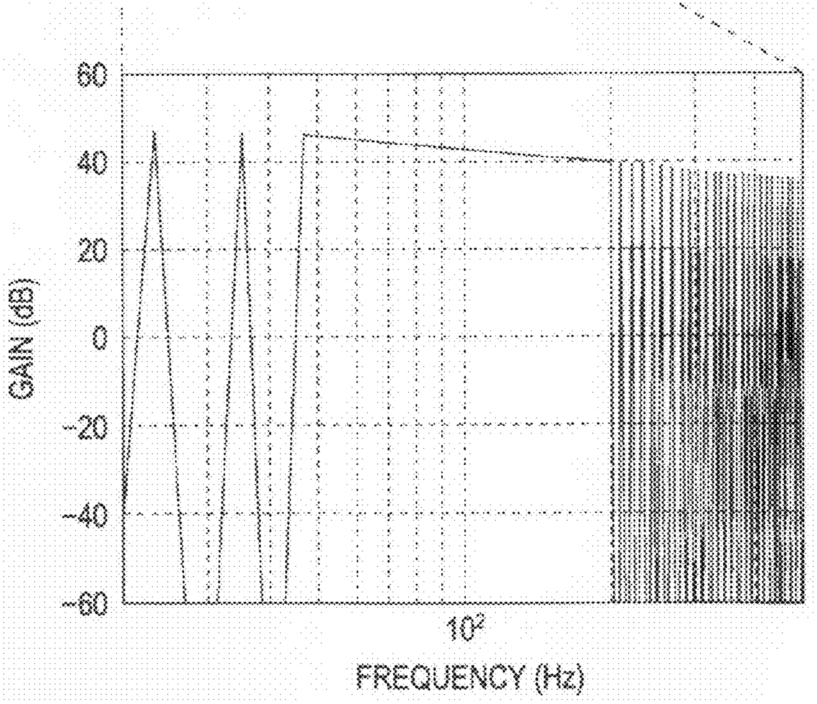

In FIGS. 3A and 3B, the abscissa represents frequency (Hz) and the ordinate represents gain (dB). FIG. 3A illustrates characteristics in a wide band from 20 Hz to 2.0 kHz. FIG. 3B illustrates characteristics in a low-frequency band from 20 Hz to 500 Hz.

As shown in FIGS. 3A and 3B, a constant gain level is provided from the high to medium frequency band, and the gain level is gradually increased in the low-frequency band as frequency is lowered.

The volume level is increased as illustrated. In accordance with the present embodiment, the amplitude in the low-frequency band is particularly intensified to prevent the S/N ratio in the low frequency band from being lowered due to the background noise.

Figure 4A:
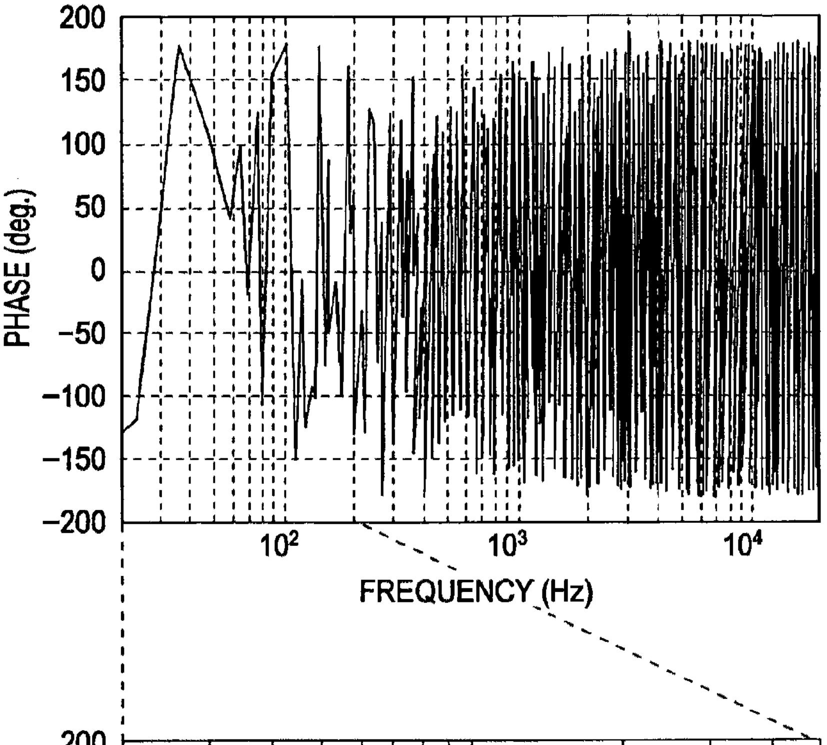
FIGS. 4A and 4B illustrate phase rotation characteristics imparted to the base signal of the measurement signal in accordance with one embodiment of the present invention.
Figure 4B:
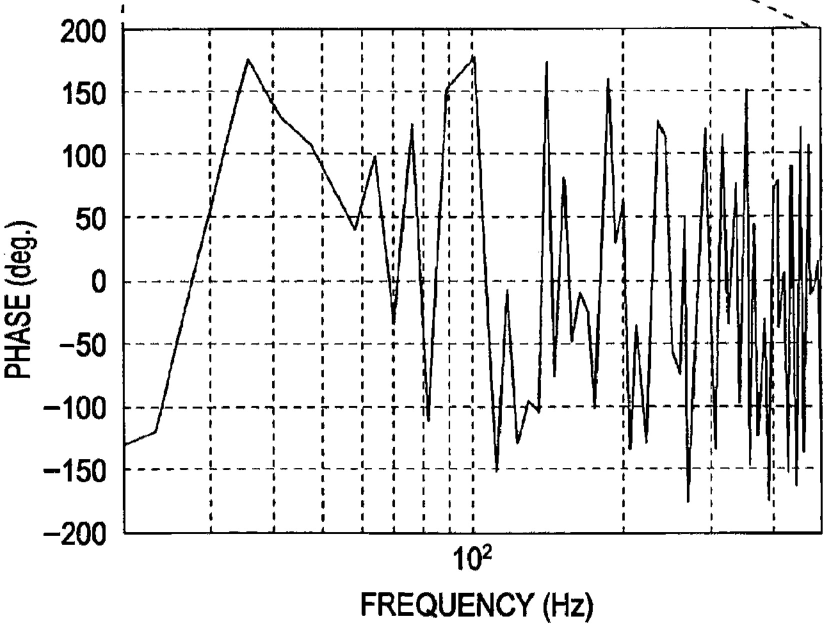

FIGS. 4A and 4B illustrate frequency-amplitude characteristics of a phase rotation imparted to the base signal in accordance with the present embodiment. The abscissa represents frequency (Hz) and the ordinate represents phase (degrees). FIG. 4A illustrates the frequency-amplitude characteristics in the frequency band of from 20 Hz to 2.0 kHz, and FIG. 4B illustrates the frequency-amplitude characteristics in the frequency band of from 20 Hz to 500 Hz.

The gain characteristics imparted to the base signal are briefly discussed here and will be described in detail later.

A phase range is not limited to the one shown in FIGS. 4A and 4B. Any phase range may be used as long as the time-domain base signal has energy spread in the time domain.

In accordance with the present embodiment, the measurement signal for acoustic measurement is generated based on a period signal of 4096 samples that is generated by performing on the base signal the phase rotation and volume level increasing process featuring the above-described characteristics.

Figures 5A, 5B, 5C:
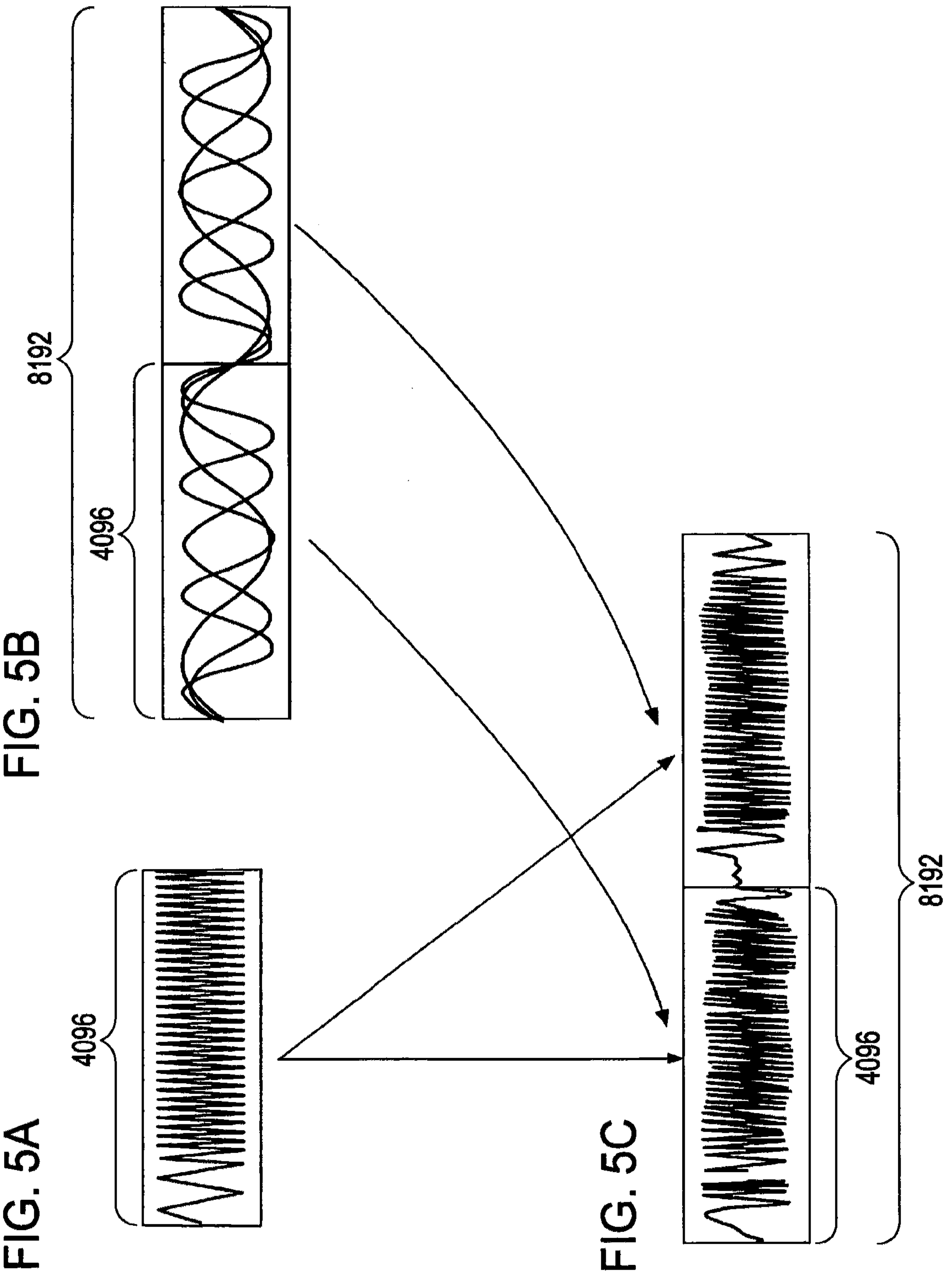
FIGS. 5A-5C diagrammatically illustrate a generation method of the measurement signal in accordance with one embodiment of the present invention.

FIGS. 5A-5C diagrammatically illustrates a generation method of the measurement signal in accordance with one embodiment of the present invention.

FIG. 5A illustrates a time-domain period signal having 4096 samples generated from the base signal.

The measurement signal of the present embodiment is generated by synthesizing a sinusoidal wave of FIG. 5B with the period signal of 4096 samples.

The sinusoidal wave has a length of 8192 samples twice as large as 4096 samples and an odd-number wave count within a period of 8192 samples (i.e., a wave count of other than an integer multiple of 2). As shown in FIG. 5C, the sinusoidal wave of 8192 samples is synthesized with two consecutive concatenated period signals, each having 4096 samples of FIG. 5A.

Figure 6:
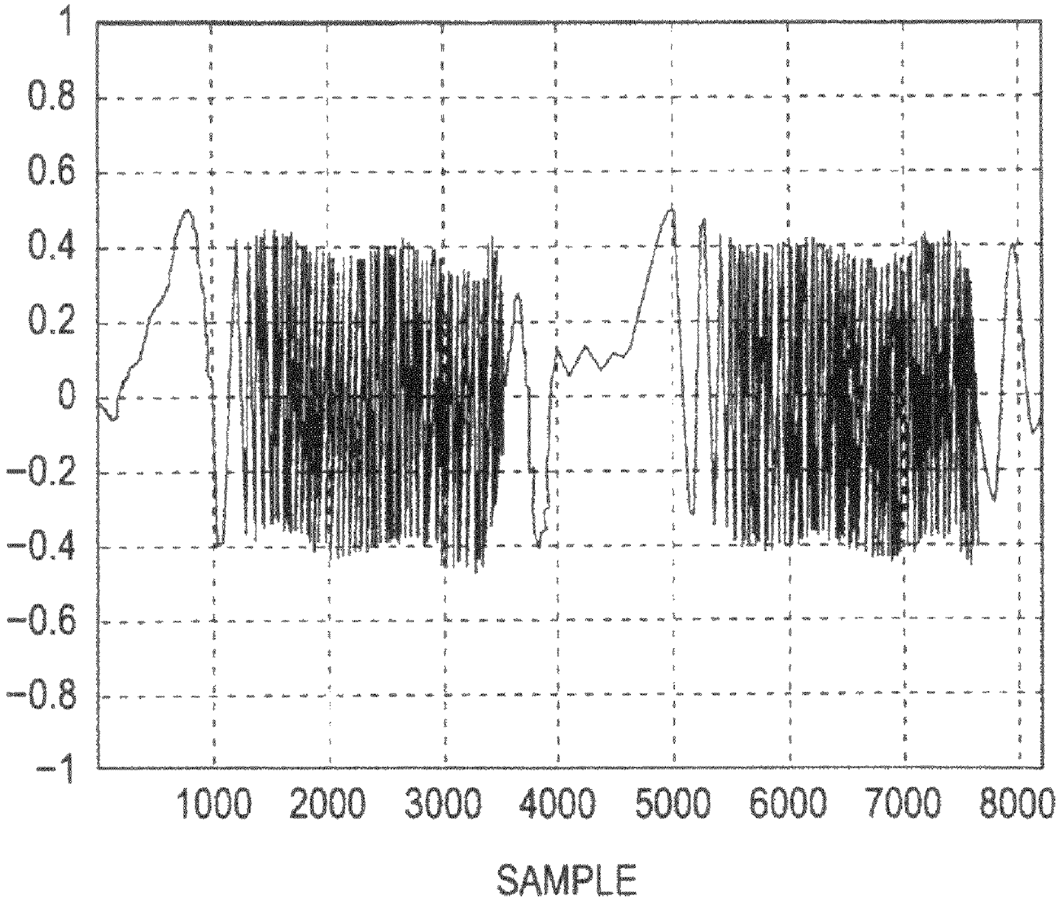
FIG. 6 illustrates a time-domain waveform of the measurement signal in accordance with one embodiment of the present invention.

FIG. 6 illustrates in detail the measurement signal produced using the technique described above. The abscissa represents the number of samples and the ordinate represents amplitude values in detail.

The waveform of the measurement signal of FIG. 6 appears to be a repetition of the period signal of 4096 samples but is a signal of one period of 8192 samples (i.e., a period signal of 8192 samples).

This may be understood from the waveform of the sinusoidal wave of FIG. 5B. With reference to FIG. 5B, the waveform crosses at the 4096-th sample thereof at a zero-crossing point from positive to negative and crosses at the 8192-th sample thereof at a zero-crossing point from negative to positive. The measurement signal of FIG. 6 obtained by synthesizing the sinusoidal wave of FIG. 5B has a slightly different waveform between the first half 4096 samples and the second half 4096 samples. As a result, a total of 8192 samples forms one period.

The measurement signal of the present embodiment thus produced is examined. In accordance with the definition of the base signal, the period signal of FIG. 5A as an original signal has amplitude components only at (Fs/N)*k (k=0–integer of N/2) in the frequency domain. More specifically, the period signal of N samples has only a component of the sinusoidal wave having a wave count of an integer.

The measurement signal of the present embodiment is generated by synthesizing a sinusoidal wave having an odd-number wave count within the 8192 samples with the two concatenated period signals of FIG. 5A.

When the period signals are concatenated, the wave count of each sinusoidal wave contained therein is respectively doubled. If the period signal of 4096 samples contains only the sinusoidal waves each having an integer wave count, the 8192 sample signal having the two concatenated period signals contains only the sinusoidal waves each having an even-number wave count. In accordance with the present embodiment, the 8192 sample signal is synthesized with the sinusoidal wave having an odd-numbered wave count within the 8192 sample period. The measurement signal of the present embodiment contains a sinusoidal wave component having a medium period in the sinusoidal wave component originally contained in the period signal of FIG. 5A. The addition of the medium sinusoidal wave component increases the frequency resolution in the frequency analysis results.

More specifically, the addition of an odd-numbered component between the even-numbered component doubles the frequency resolution.

In accordance with the measurement signal of the present embodiment, the selection of the wave count (period) of the sinusoidal wave to be synthesized selectively sets the band sought to be increased in frequency resolution.

Figure 7:
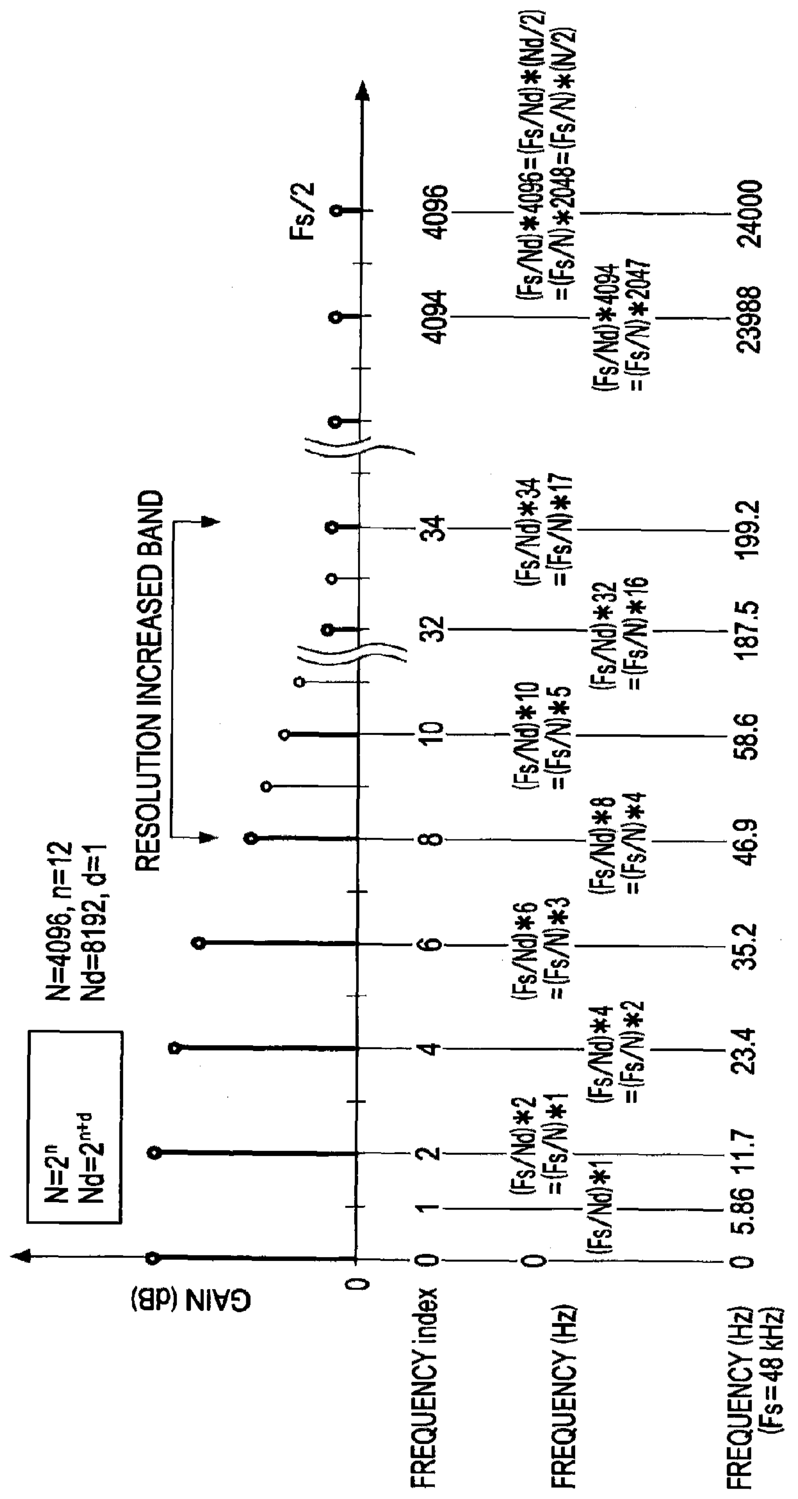
FIG. 7 illustrates frequency analysis results of the measurement signal generated under the condition of n=12 and d=1.

FIG. 7 illustrates frequency analysis results of the measurement signal. The abscissa represents frequency index and the ordinate represents gain.

As shown in FIG. 7, the measurement signal of 8192 samples is frequency analyzed by a unit of 8192 samples for convenience of explanation. This does not mean that the frequency analysis of the measurement signal is actually performed by a unit of 8192 samples.

When two period signals of 4096 of FIG. 5A are concatenated as previously discussed, only the sinusoidal waves, each having an even-numbered wave count are obtained. From this fact, the frequency analysis results of the measurement signal of 8192 samples shows by heavy lines that only an even-numbered index has an amplitude value.

The wave count is doubled, but the frequency itself remains unchanged. The frequencies of the even-numbered indexes are in steps of 11.7 Hz.

As shown in FIG. 7, the frequency resolution may be doubled in a band of from about 46.9 Hz to about 199.2 Hz as labeled "RESOLUTION INCREASED BAND."

As represented by thin lines, it is sufficient if amplitude values are assigned to odd-numbered indexes between the even-numbered indexes of from frequency index "8" through frequency index "34." More specifically, it is sufficient if amplitude values are assigned to the frequency indexes "9," "11," . . . "33."

To assign the amplitude values to the odd-numbered indexes, the sinusoidal waves having "9," "11," . . . "33" are synthesized as the sinusoidal wave of 8192 samples of FIG. 5B.

In the resolution increased band, only the sinusoidal waves having the odd-numbered wave counts are synthesized to interpolate between the odd-numbered indexes within a portion of the band. The frequency resolution is thus efficiently increased.

The measurement signal is thus generated by synthesizing only the sinusoidal wave having the wave count responsive to the band sought to be increased in frequency resolution. During frequency analysis, only the sinusoidal wave thus added is analyzed.

The present embodiment is free from an increase by an power of 2 in each of the amount of calculation for analysis and the memory capacity as a result of merely increasing the number of samples N in an attempt to increase frequency resolution. The present embodiment controls an increase in each of the calculation amount and the memory capacity in the frequency resolution increasing process.

For simplicity of explanation, the measurement signal for doubling the frequency resolution has been discussed. Using the measurement signal of the present embodiment, the frequency resolution may also be quadrupled or octupled.

The measurement signal for octupling the frequency resolution is described below with reference to FIG. 8.

Figure 8:
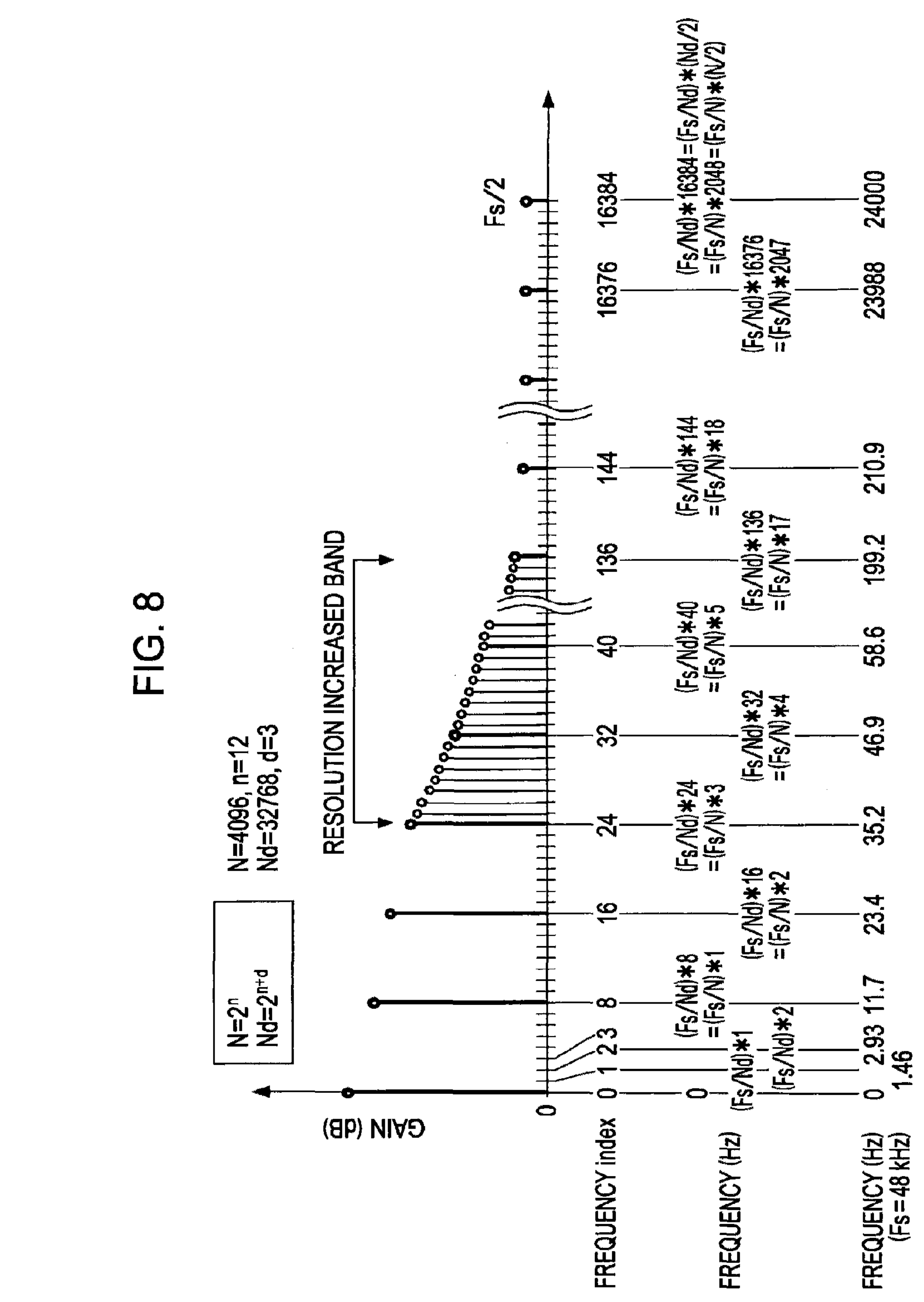
FIG. 8 illustrates frequency analysis results of the measurement signal generated under the condition of n=12 and d=3.

FIG. 8 illustrates results of frequency analysis that is performed on the measurement signal (by a unit of 22768 (4096×8) samples) for octupling the frequency resolution. As in FIG. 7, the abscissa represents frequency indexes and the ordinate represents gain in FIG. 8.

To double the frequency resolution, two period signals of 4096 samples are concatenated. The concatenation of two original period signals allows only the component of the even-numbered indexes to be obtained and an odd-numbered sinusoidal wave is the synthesized to allow odd-numbered indexes to interpolate between the even-numbered sinusoidal waves. The frequency resolution is thus doubled.

To octuple the frequency resolution, eight period signals of 4096 samples are concatenated and frequency indexes eight times the original period signal component are obtained. Sinusoidal waves having wave count of other than eight times is synthesized to allow an integer index to interpolate between the frequency indexes 8 times. More specifically, the sinusoidal waves having the wave count of other than an integer multiple of 8 within the 32768 samples are synthesized with eight period signals concatenated (4096×8=32768 samples). The frequency indexes of other than an integer multiple of 8 are interpolated in the frequency domain. The frequency resolution is thus octupled.

FIG. 8 illustrates a band of from 35.2 Hz to 199.2 Hz as a resolution increased band. More specifically, the resolution increased band corresponds to frequency indexes of from "24" through "136." The frequency indexes of other than an integer multiple of 8, namely, frequency indexes "25," "26," "27," . . . "135" are simply filled so that all integer indexes of from "24" through "136" are filled.

It is thus sufficient if the sinusoidal waves having the wave counts "25," "26," "27," . . . "135" within the period of the 32768 samples having a length of 32768 samples are synthesized with the eight concatenated period signals of 4096 samples.

As a result, the frequency resolution is octupled within the resolution increased band.

The measurement signal for doubling or octupling the frequency resolution is generally defined as below.

The measurement signal of the present embodiment is defined as a signal that is produced by concatenating $2^d$ period signals, each having a time-domain waveform of $2^n$ samples, and synthesizing a sinusoidal wave having a wave count of other than an integer multiple of $2^d$ within the concatenation period of $2^d$ period signals. Here, "n," and "d" are respectively natural numbers.

The use of the measurement signal defined as above heightens the frequency resolution by "$2^d$", times. More specifically, given n=12 and d=1, a period signal has a period of $2^{12}$=4096 samples. If a signal produced by concatenating $2^1$ period signals and a sinusoidal wave having a wave count of other than $2^1$ within the concatenation period $2^1$ are synthesized, the frequency resolution is doubled.

For example, given n=12 and d=3, a period signal has a period of $2^{12}$=4096 samples. If a signal produced by concatenating $2^3$ (=8) period signals and a sinusoidal wave having a wave count of other than an integer multiple of $2^3$ within the concatenation period $2^3$ are synthesized, the frequency resolution is increased by $2^3$ (=8) times.

The measurement signal of the present embodiment has been discussed with respect to the time domain. The definition of the measurement signal of the present embodiment in the frequency domain is also discussed. The measurement signal of the present embodiment is understood as the one that is obtained by converting into a time-domain signal a frequent-domain signal designed in accordance with a variety of conditions and equations using inverse Fourier transform such as inverse fast Fourier transform (IFFT).

In the discussion that follows, the number of samples N of the original period signal in the generation of the measurement signal of the present embodiment is also referred to as "$2^n$". The number of samples N of the period signal is $2^n$.

The measurement signal is a signal having N×$2^d$ samples in one period produced by concatenating $2^d$ period signals of N=$2^d$.

Let "Nd" represent number of samples per one period of the measurement signal, and Nd=N×$2^d$=$2^n$×$2^d$=$2^{n+d}$, thus Nd=$2^{n+d}$. The relationship of the values of "N," "Nd," "n" and "d" is also illustrated in FIGS. 7 and 8.

Let k represent the frequency index, and the measurement signal having the number of samples Nd=$2^{n+d}$ in one period thereof is thus described in the frequency domain as follows:

Condition A1 k: integer satisfying 0≦k≦$2^{n+d}/2$ and being an integer multiple of $2^d$ including zero (or integer h satisfying 0≦h≦$2^n/2$ and h=k/$2^d$)

$$H(k) = A(k)\cdot\exp(-j\phi(k)) \tag{5}$$

$$\phi(h) = \frac{M\pi}{\sum_{l=0}^{(2^n)/2} D(l)} \cdot \sum_{g=0}^{h} D(g) = \phi(k/2^d) \tag{6}$$

$$D(h) = \sum_{g=0}^{h} A^2(g) = D(k/2^d) \tag{7}$$

Condition A2 k: integer satisfying 0<k<$2^{n+d}/2$, and failing to satisfy condition A1 with Fs/$2^{n+d}$*k [Hz] falling within the resolution increased band $$H(k)=A(k)\cdot\exp(-j\phi(k)) \tag{8}$$

φ(k): any phase

Condition A3 k: integer satisfying 0<k<$2^{n+d}/2$, and failing to satisfy condition A1 with Fs/$2^{n+d}$*k [Hz] falling outside the resolution increased band $$H(k)=A(k)\cdot\exp(-j\phi(k))=0 \tag{9}$$

Condition A4 k: integer satisfying $2^{n+d}/2+1$≦k≦$2^{n+d}-1$ $$H(k)=H^*(2^{(n+d)}-k) \tag{10}$$

A(k) is defined in the frequency domain in each of the above series of equations, and basically any amplitude curve composed of real number.

In accordance with the present embodiment, an amplitude curve providing a large amplitude in the low-frequency band is applied as a step to overcome the background noise that can be a problem during use at home (see FIGS. 3A and 3B). As shown in FIGS. 7 and 8, the amplitude curve is set so that gain in the low-frequency band becomes higher.

The condition A1 is a condition under which k is an integer multiple of $2^d$ within the first half of the indexes k (0≦k≦$2^{n+d}/2$) when the time-domain waveform of $2^{n+d}$ samples is viewed in the frequency domain. As previously discussed, with n=12 and d=3 (with N=4096 to octuple the frequency resolution), the first half indexes of $12^{12+3}$=32768 are k=0, 8, 16, 32, . . . . In the description of the condition A1, simplified h is used. Since h=k/$2^3$, h=0, 1, 2, 3, 4 . . . .

The condition A1 is based on the premise that each of energy spectrum, group delay and phase is related to frequency in a relation of differentiation and integration in a sinusoidal wave sweep signal having a constant amplitude in the time domain. This is disclosed in Technical Report of IEICE by Moriya and Kaneta "A study on the optical signal on impulse response measurement" (the Institute of Electronics, Information and Communication Engineers of Japan (IEICE)).

In equations (5) through (7), φ(k) represents phase information and D(k) represent group delay. $A(k)^2$ is a square of amplitude and thus energy. Equation (6) is means for phase normalization to prevent discontinuity at k=$2^{n+d}/2$ in the frequency domain. Also, in equation (6), M represents any integer value related to a constant amplitude period of the measurement signal. The magnitude of M defines the length of the constant amplitude period of the time-domain measurement signal.

The condition A2 applies to the resolution increased band sought to be increased in frequency resolution to $2^d$ times. The frequency-domain amplitude follows the amplitude curve of A(k), and phase condition may be basically any condition. As described in connection with the condition A2, an index satisfying the condition A1 within the resolution increased band follows the condition A1.

The condition A3 sets a point other than points satisfying the condition A1 and the condition A2 to zero.

The condition A4 is a general condition required to express a waveform of the measurement signal of the present embodiment defined in the frequency domain correctly into a real number in the time domain.

The amplitude curve set for the measurement signal is basically any curve. In accordance with the present embodiment, the amplitude curve is set to enlarge the amplitude in the low-frequency band as a step to overcome the background noise as previously discussed.

Any condition may be set for the phase condition as discussed with reference to the condition A2. In accordance with the present embodiment, the phase condition taking into consideration that the measurement signal does not have a large amplitude value in the time domain is set.

More specifically, M of the condition A1 is M=5000, and a function expressing the amplitude curve is defined by equation (11). Equation (11) expresses a function with the sampling frequency Fs=48 kHz, n=12 and d=1 (Nd=8192 to double the frequency resolution):

$$A(k)=1.0,\ k=0$$

$$A(k)=\sqrt{1.0/k},\ 0<k<512$$

$$A(k)=\sqrt{1.0/512},\ 512\leqq k\leqq 8191 \tag{11}$$

A signal is designed in accordance with equation (11), the above-described conditions and definitions, and the time-domain waveform thus determined is shown in FIG. 6. The time-domain waveform expressed in terms of frequency-domain amplitude and frequency-domain phase is shown in FIGS. 3A and 3B and 4A and 4B.

A measurement operation using the measurement signal in accordance with a first embodiment of the present invention is described below.

The measurement operation in the sound field correction process is performed by the DSP 4 for acoustic measurement. The sound field correction process is automatically performed by the AV amplifier 1 in response to a user operation.

More specifically, a command to start the sound field correction process is issued to the CPU 9 in response to the user operation to the operation unit 8 of FIG. 2. The CPU 9 controls the switch SW to select the terminal t2, thereby allowing an signal to be input from the microphone M. The CPU 9 commands the DSP 4 to start the measurement operation.

The measurement operation of the first embodiment of the present invention is thus executed in response to the start command from the CPU 9.

Figure 9:
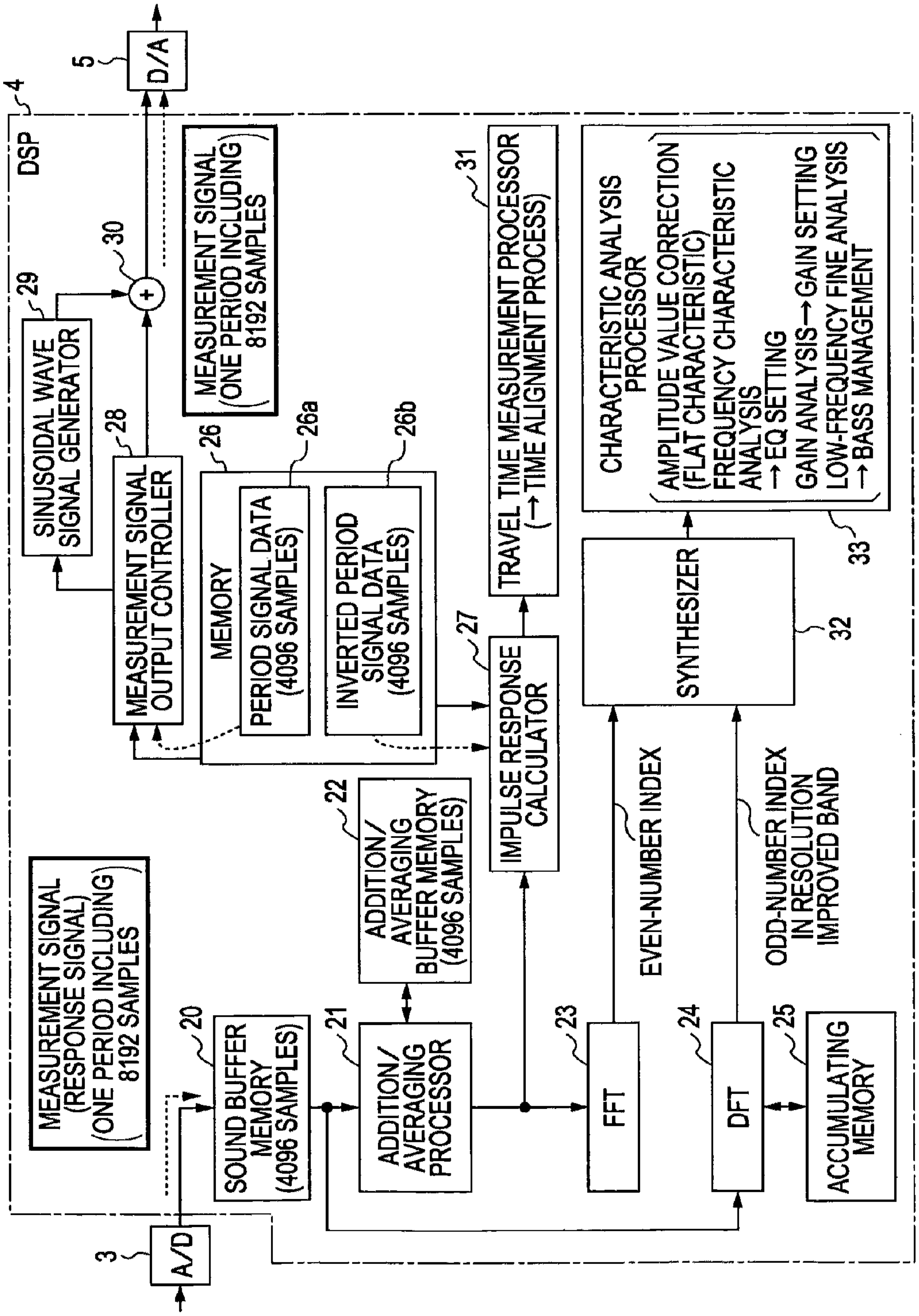
FIG. 9 is a block diagram illustrating a signal processing apparatus in accordance with a first embodiment of the present invention.

FIG. 9 is a block diagram illustrating the DSP 4 performing the measurement operation in accordance with the first embodiment of the present invention. FIG. 9 illustrates n=12, d=1 (N=4096 and Nd=8192) for the period signal, the number of samples of the measurement signal, and memory capacities for simplicity of explanation.

As shown in FIG. 9, the DSP 4 includes a sound buffer memory 20, an addition/averaging processor 21, an addition/averaging buffer memory 22, a fast Fourier transform (FFT) processor 23, a discrete Fourier transform (DFT) processor 24, an accumulating memory 25, a memory 26, an impulse response calculator 27, a measurement signal output controller 28, a sinusoidal-wave signal generator 29, an adder 30, a travel time measurement processor 31, a synthesizer 32 and a characteristics analysis processor 33.

The measurement signal output controller 28, the sinusoidal-wave signal generator 29 and the adder 30 are arranged to generate and output the measurement signal of the first embodiment of the present invention. With the measurement signal output controller 28, the sinusoidal-wave signal generator 29 and the adder 30 arranged, the memory capacity for outputting the measurement signal is reduced.

As shown in FIG. 9, the memory 26 stores the period signal of $N=2^n$ samples as the period signal data 26*a* as shown in FIG. 5A. The measurement signal output controller 28 successively reads the period signal data 26*a* from the memory 26 and outputs the period signal data 26*a* to the adder 30. The period signal data 26*a* is output to the adder 30 in a manner such that the period signal of $2^n$ samples is output by an integer multiple of $2^d$ times.

The measurement signal output controller 28 controls the sinusoidal-wave signal generator 29, thereby outputting the sinusoidal wave to the adder 30. The sinusoidal-wave signal generator 29 generates sinusoidal waves at the wave count responsive to the index other than an integer multiple of $2^d$ within a predetermined resolution increased band in accordance with sine (sin) function (table). More specifically, as shown in FIG. 7, sinusoidal waves having wave counts 9, 11, 13, . . . , 33 within the period of Nd=8192 samples are generated.

The measurement signal output controller 28 controls the sinusoidal-wave signal generator 29 so that each sinusoidal wave signal is output in the same time length as the output of the period signal data 26*a*.

The adder 30 reproduces the measurement signal in a period concatenated manner. The measurement signal is produced by synthesizing a signal of $Nd=2^{n+d}$ composed of $2^d$ period signals of $2_n$ samples with the sinusoidal wave having the wave count of other than $2^d$ within the period of $ND=2^{n+d}$ samples.

The measurement signal is reproduced in a period concatenated manner because the pickup signal is synchronization addition/averaged in order to increase the S/N ratio during measurement.

With the above-described construction, the memory capacity required to output the measurement signal is reduced to a capacity for $2^n$ samples for the period signal data 26*a*. For example, the measurement signal of the present embodiment of $Nd=2^{n+d}$ samples can be stored on the memory 26. In comparison with that case, a required memory capacity is reduced to $\frac{1}{2}^d$. Given the same frequency resolution, if the number of samples of the measurement signal is d times as in the related art, the required memory capacity during outputting is $Nd=2^{n+d}$ samples. In comparison with this case as well, the memory capacity is reduced to $\frac{1}{2}^d$.

The measurement signal synthesized and output from the adder 30 is supplied the D/A converter 5 external to the DSP 4. As previously discussed with reference to FIG. 2, the signal supplied to the D/A converter 5 is converted into an analog signal. The analog signal is then amplified by the amplifier 6 and output to the loudspeakers SP via the speaker output terminal Tout. The sound responsive to the analog signal is thus emitted from the loudspeakers SP as the measurement signal.

The measurement signal output from the loudspeakers SP is picked up by the microphone M as a response signal having traveled through space to be measured. The response signal is then supplied to the sound buffer memory 20 via the switch SW and the A/D converter 3 for buffering. The memory capacity of the sound buffer memory 20 is $2^n$ samples (for example, 4096 samples as shown).

The measurement signal (pickup signal and response signal) buffered by the sound buffer memory 20 is supplied to the addition/averaging processor 21. The addition/averaging processor 21 performs a synchronization addition process and an averaging process (both collectively referred to as a synchronization addition and averaging process). The addition/averaging processor 21 performs the synchronization addition and averaging process on the pickup signal by a unit of $N=2^n$ samples using the addition/averaging buffer memory 22 having a memory capacity of 4096 samples ($N=2^n$ samples).

In accordance with the measurement method of the related art using the TSP signal as the measurement signal, the synchronization addition and averaging process is performed by a unit of the number of samples N of the measurement signal. In accordance with such a related art, it may be considered appropriate that the synchronization addition and averaging process is performed on the measurement signal (pickup signal) having one period of $Nd=2^{n+d}$ samples by a unit of Nd samples.

In such a case, the impulse response of the pickup signal needs to be calculated while the frequency-amplitude characteristics are analyzed based on the pickup signal. To calculate the impulse response, only a response signal component of the original period signal of $N=2^n$ samples needs to be obtained as synchronization addition and averaging results. More specifically, if the synchronization addition and averaging process is merely performed on (the response signal of) the measurement signal, produced by synthesizing the concatenation of $2^d$ period signals of $2^n$ samples with the sinusoidal wave, the impulse response cannot be appropriately calculated from the process results.

For this reason, the addition/averaging processor 21 synchronization adds the pickup signal by a unit of $2^n$ samples.

However, a mere synchronization addition by a unit of $2^n$ samples does not result in only a response signal component of the original period signal of $N=2^n$ samples as the synchronization addition and averaging results.

The structure of the measurement signal of the present embodiment is considered again. For example, with n=12 and d=1, the measurement signal of 8192 samples is produced by synthesizing a sinusoidal wave having an odd-numbered wave count and a sinusoidal wave having an even-numbered wave count based on the original period signal of 4096 samples. As previously discussed, the first half of 4096 samples and the second half of 4096 samples of the synthesized sinusoidal wave of 8192 samples are different in phase by 180 degrees.

Taking advantage of such a property of the measurement signal, the synchronization addition process is performed on the pickup signal of the measurement signal by an even number of times (i.e., by an integer number of 2 times), odd-numbered components cancel each other.

FIGS. 10A and 10B and 11A and 11B illustrate how the odd-numbered components cancel each other.

Figure 10A:
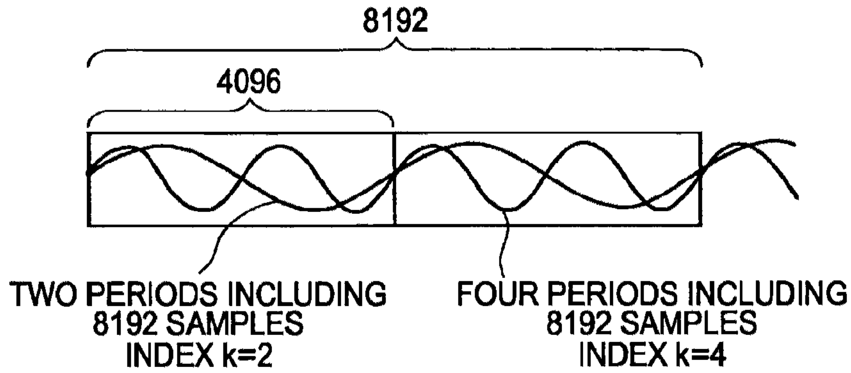
FIGS. 10A and 10B illustrate how a sinusoidal wave having an even-number wave count is synchronization addition/averaged.
Figure 10B:
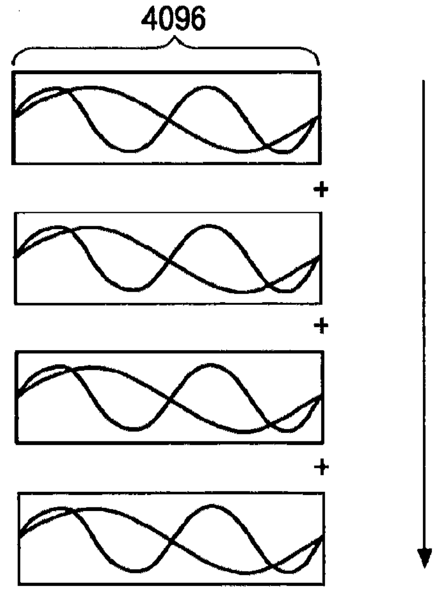

FIGS. 10A and 10B illustrate how the sinusoidal waves having an odd-numbered wave count and an even-numbered wave count are synchronization added and averaged.

The sinusoidal waves having two waves and four waves as the wave counts within the 8192 samples are shown in FIGS. 10A and 10B. The sinusoidal waves having two waves and four waves as the wave counts within the 8192 samples are respectively referred to as indexes k="2" and "4."

The sinusoidal waves having the wave counts as 2 waves and 4 waves in 8192 samples are synchronization added and average by a unit of 4906 samples as represented by an arrow-headed line. The phases of the sinusoidal waves become the same phase every 4096 samples and signal components of the waves are intensified each time addition is performed. The signal component of the sinusoidal wave having the even-numbered wave count, in other words, the signal component of the original period signal of 4096 samples is increased in S/N ratio through the synchronization addition and averaging process.

Figure 11A:
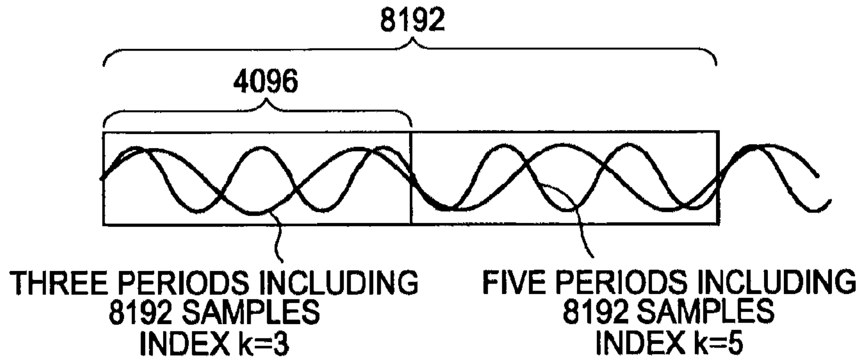
FIGS. 11A and 11B illustrate how a sinusoidal wave having an odd-number wave count is synchronization addition/averaged.
Figure 11B:
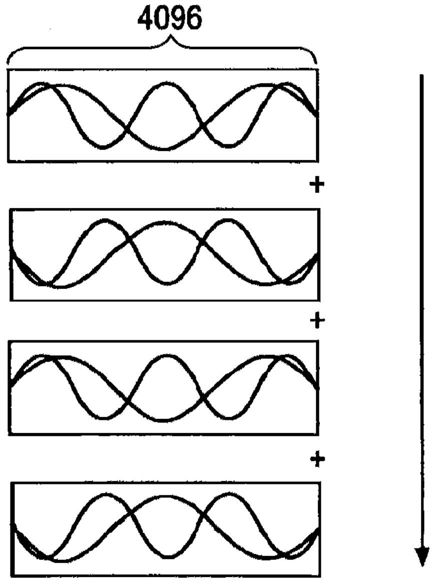

FIGS. 11A and 11B illustrate the sinusoidal waves of odd-numbered wave counts, namely, three waves and five waves. The indexes k of the sinusoidal waves having the wave count 3 and the wave count 5 are "3" and "5," respectively.

The first half 4096 samples and the second half 4096 samples of the sinusoidal waves having the odd-numbered wave counts are different from each other in phase by 180 degrees. If the synchronization addition and averaging process is performed by an even number of times, the signal components of the sinusoidal waves cancel each other and are thus eliminated.

With n=12 and d=1, only the sinusoidal wave component synthesized with the original period signal of 4096 samples is canceled by performing the synchronization addition on (the pickup signal of) the measurement signal by a unit of 4096 samples by an even number of times (an integer multiple of 2 times). As the addition and averaging results obtained from averaging the synchronization addition results, only the response signal of the original period signal of 4096 samples prior to synchronization is obtained.

As described above, the frequency resolution is doubled with n=12 and d=1 and the number of synchronization additions being an even number (an integer multiple of 2). The number of synchronization additions to be set in order to obtain only the response signal component responsive to the original period signal of $2^n$ samples as the synchronization addition results is generally defined as "an integer multiple of $2^d$ times."

In other words, the synchronization addition is cycled through at least once the $2^d$ pickup signals of $2^n$ samples contained in the measurement signal (pickup signal) of $Nd=2^{n+d}$ samples.

According to the above definition, to octuple the frequency resolution with d=3, the number of synchronization additions performed on the measurement signal (pickup signal) of $Nd=2^{n+d}$ samples by a unit of $N=2^n$ samples is $2^3=8$ times. In other words, the synchronization addition is cycled through once eight pickup signals of $N=2^n$ samples contained in the measurement signal (pickup signal) of $Nd=2^{n+d}$ samples.

The synchronization addition is thus performed on a per unit of $N=2^n$ samples basis by an integer multiple of $2^d$ times. In practice, the number of synchronization additions is 10 with n=12 and d=1 in accordance with the present embodiment.

Figure 12:
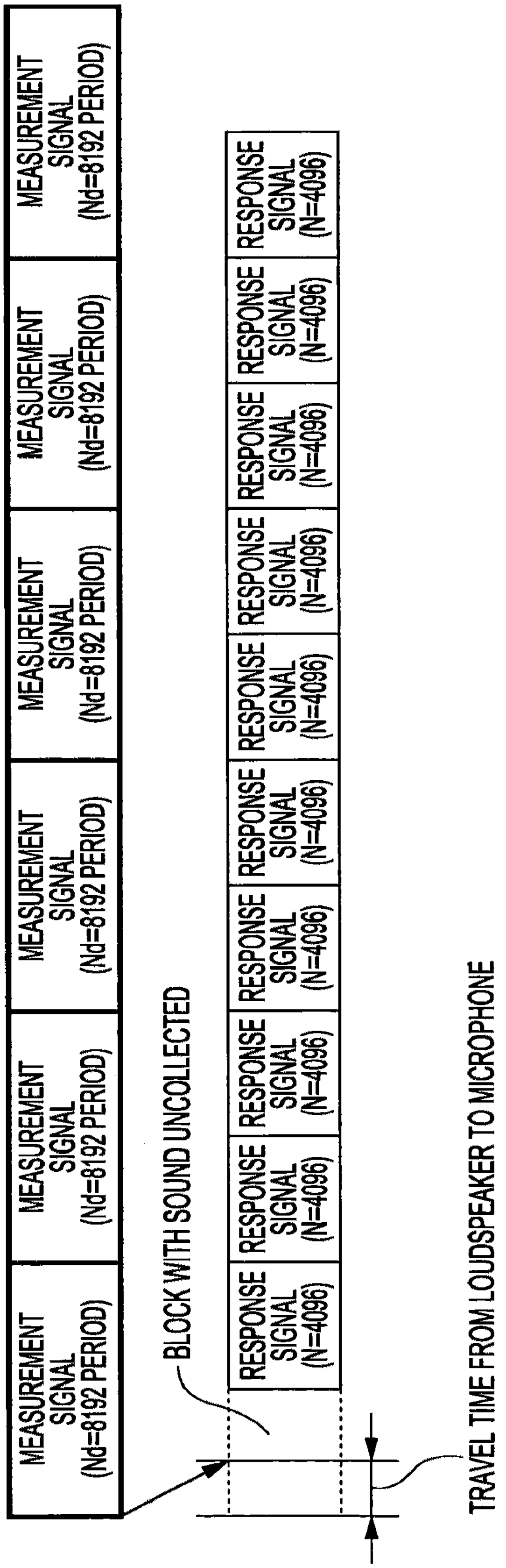
FIG. 12 illustrates a relationship between the number of reproductions (number of outputs) of the measurement signal and the number of pickups.

FIG. 12 illustrates a relationship of the number of reproductions (outputs) of the measurement signal and the number of pickups of the measurement signal with the synchronization additions performed on a per unit of 4096 ($2^n$ samples) basis by 10 times.

The synchronization addition is now performed on a per unit of 4096 samples basis by 10 times. To obtain the pickup signal of 4096 samples by 10 times, five times of reproduction and outputs of the measurement signal of 8192 samples are sufficient. However, in practice, no continuous response waveforms cannot be obtained in a first block due to the air travel time between each of the loudspeakers SP and the microphone M. Data of the first pickup block needs to be discarded. In the measurement of successive period reproduction, the number of reproduction is set to be higher than the number of pickups by one. In this case, the measurement signal needs to be output by six times.

When the frequency resolution is increased with d>1, the first pickup signal of $2^n$ samples is discarded and the synchronization addition then starts with the next pickup signal of $2^n$ samples.

Returning back to FIG. 9, only the response signal component of the original period signal of $2^n$ samples is determined through the synchronization addition and averaging process. The impulse response is appropriately calculated based on the synchronization addition and averaging results.

The impulse response is calculated by the impulse response calculator 27.

As previously described, the impulse response is determined by multiplying the pickup signal by an inverted signal of the measurement signal in the frequency domain and inverse Fourier transforming (IFFT) the resulting product. The inverted signal for determining the impulse response is stored as the inverted period signal data 26*b* on the memory 26.

The inverted period signal is a signal that is intended to impart inverted characteristics to the phase rotation and volume increasing process performed to the base signal. The base signal has served as a base for generating the period signal of $2^n$ samples.

The inverted period signal corresponding to the period signal is represented in the frequency domain as follows:

Condition B1 h: integer satisfying $0 \leqq h \leqq 2^n/2$ $$H(h) = (1/A(h)) \cdot \exp(+j\phi(h)) \tag{12}$$

$$\phi(h) = \frac{M\pi}{\sum_{l=0}^{2^n/2} D(l)} \cdot \sum_{g=0}^{h} D(g) \tag{13}$$

-continued $$D(h)=\sum_{g=0}^{h}A^2(g) \tag{14}$$

Condition B2 h: integer satisfying $2^n/2+1 \leqq h \leqq 2^n-1$ $$H(h)=H^*(2^n-h) \tag{15}$$

The impulse response calculator 27 calculates the impulse response based on the inverted period signal data 26$b$ described above and the synchronization addition and averaging results from the addition/averaging processor 21. More specifically, the impulse response calculator 27 multiplies the synchronization addition and averaging results by the inverted period signal data 26$b$ in the frequency domain, and performs the IFFT on the results. The impulse response thus results.

The impulse response data obtained from the impulse response calculator 27 is supplied to the travel time measurement processor 31. Based on the impulse response data, the travel time measurement processor 31 measures the travel time between the loudspeaker SP and the microphone M, thereby obtaining the distance information between the loudspeaker SP and the microphone M. The distance information is used in the time alignment process as previously discussed.

To calculate the impulse response, the FFT is performed on the synchronization addition and averaging results. Although it has been described for convenience of explanation that the process result of the addition/averaging processor 21 is directly input to the impulse response calculator 27, FFT results of the FFT processor 23 may be input to the impulse response calculator 27 in practice. In this way, redundant FFT process may be omitted.

The frequency analysis of the measurement signal of the present embodiment is continuously discussed.

Only the response signal component of the original period signal of $2^n$ samples is determined as the synchronization addition and averaging results of the addition/averaging processor 21. If the frequency analysis is performed on the synchronization addition and averaging results, analysis result with a resolution of N/Fs (Hz) are thus obtained.

In accordance with the present embodiment, the FFT processor 23 performs the FFT on the synchronization addition and averaging results of the addition/averaging processor 21 by a unit of $2^n$ samples. The frequency analysis results in steps of Fs/N (Hz) are thus obtained. In other words, the analysis results containing the indexes of an integer multiple of $2^d$ are obtained.

In the measurement operation, amplitude data of the indexes of an integer multiple of $2^d$ is obtained from the synchronization addition and averaging results. Alternatively, amplitude data of the sinusoidal wave component synthesized into the measurement signal may be obtained by performing the frequency analysis in a separate system. More specifically, synthesis of amplitude data obtained in each system increases the frequency resolution.

The sinusoidal wave component synthesized into the measurement signal is frequency analyzed by the DFT processor 24.

The DFT processor 24 receives the pickup signal from the sound buffer memory 20 and performs the DFT process on the pickup signal using sine (sin) signal and cosine (cos) signal corresponding to the sinusoidal wave components synthesized into the measurement signal.

Figure 13:
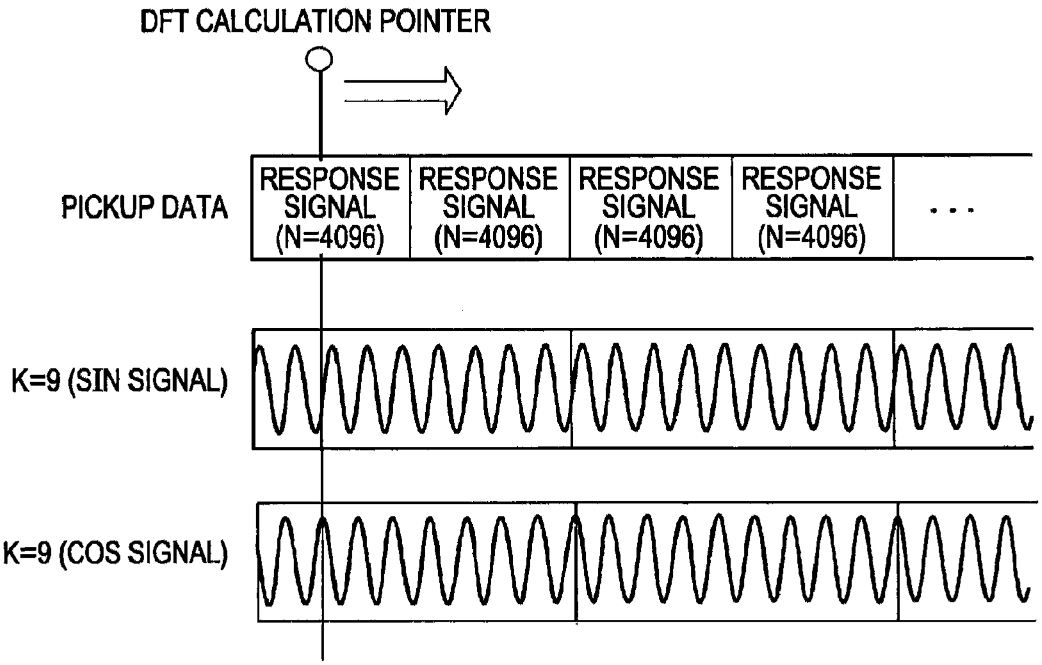
FIG. 13 illustrates a discrete Fourier transform (DFT) process performed in a measurement operation in accordance with the first embodiment of the present invention.

FIG. 13 illustrates the DFT process. With n=12 and d=1 (N=4096 and Nd=8192) as shown in FIG. 13, a frequency-amplitude value of the sinusoidal wave component having the wave count of 9 is obtained.

In the DFT process, a sine and cosine table for the sinusoidal wave component to be calculated is prepared or calculated beforehand. A DFT calculation pointer is shifted from the head of pickup data. The pickup data is multiplied by the sine data and the cosine data and the resulting products are summed as a DFT calculation pointer shifts starting with the front of the pickup data. The DFT process is thus performed. The summation results of the products of the sine data and the cosine data are stored on the accumulating memory 25 of FIG. 9.

When the multiplication and summation with the sine data and cosine data are performed from the head of the pickup data to the 8192nd sample (Nd-th sample) in one cycle, an accumulated value (scalar value) of the sinusoidal wave component is obtained. The results are used as a frequency-amplitude value of the sinusoidal wave component.

The DFT processor 25 performs the DFT process on each sinusoidal wave component synthesized into the measurement signal. For example, if the sinusoidal waves having the wave counts 9, 11, 13, . . . , 33 within 8192 samples are synthesized as shown in FIG. 7, the DFT processor 24 prepares a sine signal and a cosine signal of the sinusoidal waves of the wave counts 9, 11, 13, . . . , 33. The multiplication process is performed on the sine data and cosine data and the pickup data from the head of the pickup data to the 8192nd sample and the multiplication results are summed in the accumulating memory 25. The multiplication and summation are performed at least by one cycle to the 8192nd sample. The frequency analysis results of each sinusoidal wave synthesized are thus obtained.

The frequency analysis results can be obtained if the DFT is performed to the Nd-th sample in at least one cycle. To increase the S/N ratio, synchronization addition may be performed in the DFT system. While the response signal pickup is performed on a per unit of $2^n$ samples basis by 10 times, the DFT processor 24 performs the multiplication and summation process by a unit of 8192 samples in 5 cycles (10/2) and averages the results.

In accordance with the frequency analysis technique using the DFT processor 24, the response pickup data is summed in the accumulating memory 25. The summed data is then discarded.

For example, when the sinusoidal wave is frequency analyzed, the FFT may be performed on the pickup signal by a unit of Nd samples. In this case, however, a memory capacity for the Nd samples is needed.

In accordance with the frequency analysis using the DFT, a memory capacity required in the accumulating memory 25 is the one for summing the products of the sine data and cosine data at each sinusoidal wave component. For example, if twelve sinusoidal waves having the wave counts 9, 11, 13, . . . , 33 are stored, the required memory capacity is reduced to twelve samples.

Equations (16) and (17) are used to calculate amplitude value through the DFT:

$$|G(k)|=\left|\sum_{h=0}^{Nd-1}g(n)\cdot\exp(-j2\pi hk/Nd)\right|, \quad h=0,1,\ldots,Nd-1 \tag{16}$$

$$=\left|\sum_{h=0}^{Nd-1}\{g(n)\cdot(\cos(2\pi hk/Nd))-i\cdot g(n)\cdot(\sin(2\pi hk/Nd))\}\right| \tag{17}$$

where g(n) represents the pickup data.

Equations (16) and (17) show that the multiplication and summation starting with the head of the pickup data allows the response pickup data, once summed into the accumulating memory 25, to be discarded.

The frequency analysis results of the DFT processor 24 and the FFT processor 23 are supplied to the synthesizer 32.

The synthesizer 32 synthesizes the frequency analysis results of the FFT processor 23 (also referred to as even-numbered index) and the frequency analysis results of the accumulating memory 25 (also referred to odd-numbered index), thereby obtaining final frequency analysis results. In this way, an medium index within the resolution increased band is interpolated. A resolution increased band thus results.

The characteristics analysis processor 33 performs a variety of processes such as analyzing the frequency-amplitude characteristics based on the frequency analysis results obtained from the synthesizer 32.

The characteristics analysis processor 33 corrects the amplitude value so that the frequency-amplitude value as the frequency analysis results obtained by the synthesizer 32 becomes flat.

The frequency-amplitude characteristics are analyzed and gain is analyzed based on the correction results. As previously discussed, the analysis results of the frequency-amplitude characteristics are used to adjust the equalizer (EQ). The gain analysis results are used to set gain. The term gain contains information relating to the efficiency of the loudspeaker and sound absorption and reflection characteristics of walls, and is typically calculated from an average level of a particular band for an intended purpose of the frequency characteristics.

The characteristics analysis processor 33 performs low-frequency band fine analysis on the frequency analysis results subsequent correction. More specifically, the low-frequency band reproduction performance of each loudspeaker SP is determined based on amplitude characteristics in the resolution increased band. The determination results are used in the bass management process.

In the measurement operation of the present embodiment, the frequency analysis results of only the response signal component of the sinusoidal wave of $2^n$ samples are obtained from the results of the synchronization addition and averaging process performed by a unit of $2^n$ samples. The DFT is performed on the sinusoidal wave component and the frequency analysis results are obtained.

In the measurement operation of the present embodiment, an increase in the memory capacity for resolution improvement is only a capacity of the accumulating memory 25 for use in the DFT process (i.e., a capacity for the samples of the number equal to the number of sinusoidal waves synthesized). An increase in the amount of calculation from the standard resolution level is merely an amount of calculation for the DFT process.

The measurement operation of the present embodiment is free from an increase in the memory capacity and the amount of calculation required for the resolution improvement by contrast to the related art in which the number of samples N of the measurement signal is increased by a power of 2. More specifically, an increase in the memory capacity and the amount calculation for the resolution increase is substantially reduced.

Figure 14:
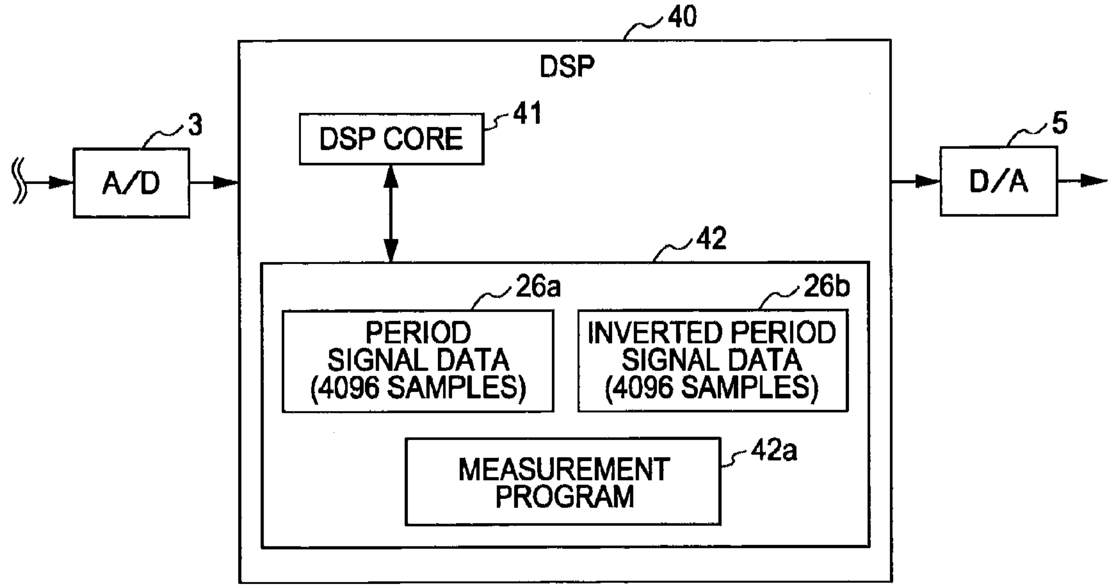
FIG. 14 is a block diagram illustrating a signal processing apparatus in which the measurement operation is implemented using software.

In the above discussion, the measurement operation of the present embodiment is performed by a hardware structure such as the one of FIG. 9. As shown in FIG. 14, the measurement operation of the present embodiment may be performed using software with a DSP 40 if the DSP 40 includes a DSP core (CPU) 41 and a memory 42.

As shown in FIG. 14, the DSP 40 is supplied with an audio signal by the A/D converter 3 of FIG. 2. The DSP 40 under the control of the DSP core 41 buffers the audio signal from the A/D converter 3 on the memory 42.

Under the control of the D/A converter 5, the audio signal buffered on the memory 42 may be output to the D/A converter 5.

The memory 42 inclusively represents the memory contained in the DSP core 41 and stores the period signal data 26*a* and the inverted period signal data 26*b* required for the measurement operation. The memory 42 also includes a measurement program 42*a* required to perform a software process of the DSP 40 for the measurement operation of the present embodiment.

Figure 15:
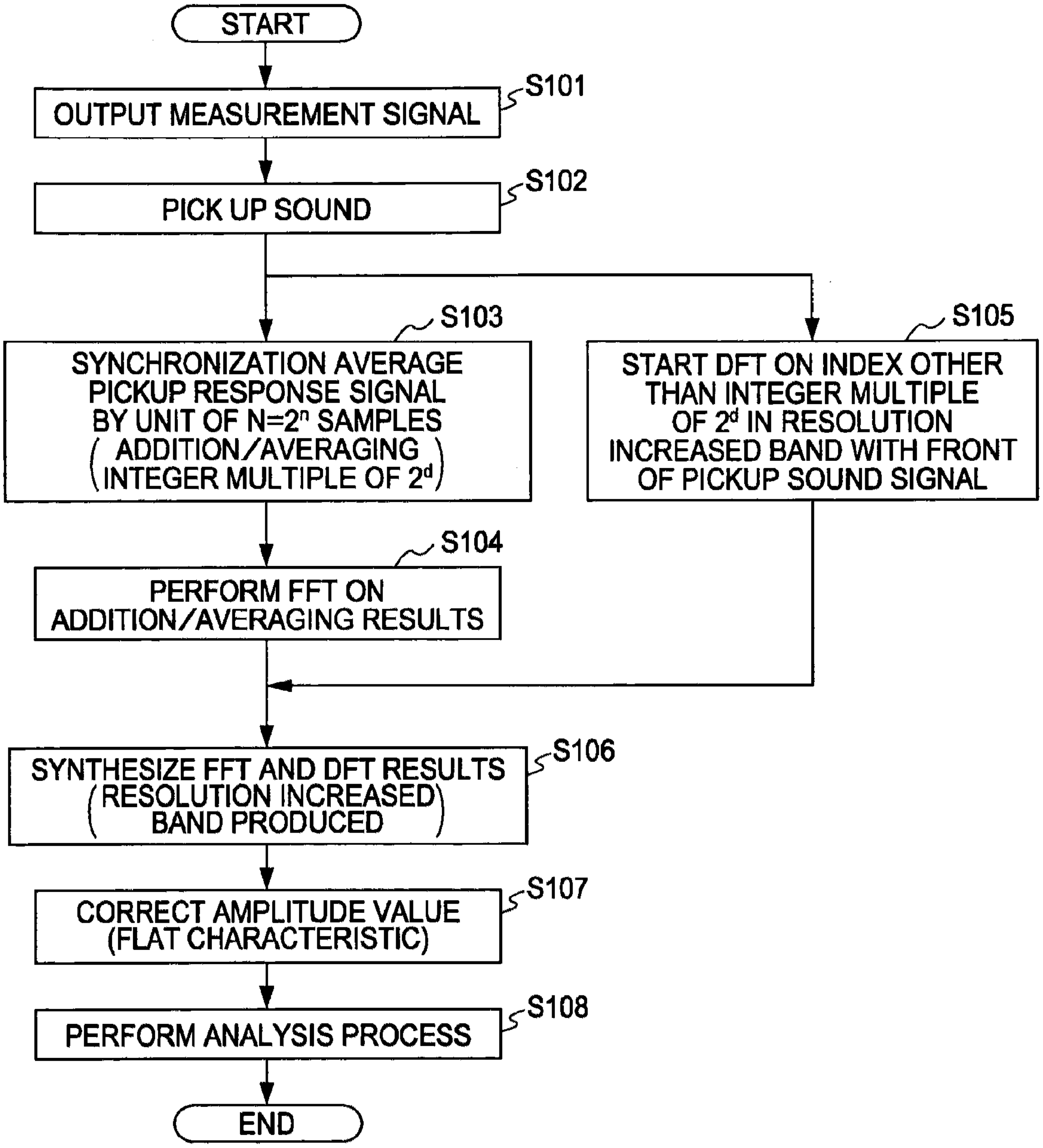
FIG. 15 is a flowchart illustrating a process to be performed to perform the measurement operation in accordance with the first embodiment of the present invention.

FIG. 15 is a flowchart illustrating the process of the DSP core 41 of FIG. 14 of performing the measurement operation of the present embodiment. The DSP core 41 performs the process in accordance with the measurement program 42*a*.

FIG. 15 illustrates, as the measurement process of the response signal as the measurement signal, only a process for measuring the frequency-amplitude characteristics not a process for measuring the impulse process.

The process here is started in response to a measurement operation start command from the CPU 9 responsive to a start command of the sound field correction process based on the user operation.

In step S101 of FIG. 15, the DSP core 41 performs a measurement signal output process. The measurement signal is output consecutively by a predetermined number of times.

More specifically, the value of the period signal data 26*a* is output from the memory 42 to the D/A converter 5. In accordance with the sine function (sine table) stored on the memory 42, the DSP core 41 synthesizes and outputs the value of the sinusoidal wave having the wave count corresponding to the index of other than an integer multiple of 2d within the resolution increased band.

The synthesis and output of the period signal and the sinusoidal wave are repeated until one period of the measurement signal containing Nd ($2^{n+d}$) samples is output by a predetermined number of times (six times to double the frequency resolution).

The signal supplied to the D/A converter 5 is also converted into an analog signal in this case. The analog signal is amplified by the amplifier 6 of FIG. 2 and output to the loudspeaker SP via the speaker output terminal Tout. The sound responsive to the analog signal is then emitted from the loudspeaker SP.

In step S102, the sound pickup process is performed. The response signal of the measurement signal input to the A/D converter 3 in step S101 is picked up. More specifically, the buffering of the input audio signal from the A/D converter 3 onto the memory 42 starts at the moment the time corresponding to $2^n$ samples has elapsed since the start of the measurement signal output process in step S101 (see FIG. 12). As previously discussed with n=12 and d=1, the synchronization addition and averaging process is performed by a unit of $2^n$ samples by ten times. In the pickup process in step S102, the synchronization addition and averaging process is performed by ten times.

As shown in FIG. 15, the measurement signal output process in step S101 is followed by the sound pickup process in step S101, the synchronization addition/averaging process in step S103 and the DFT process in step S105. With reference to FIG. 12, steps S102, S103 and S105 are performed with a portion thereof performed concurrently with the measurement signal output process.

The sound pickup process in step S102, once started, is followed by the synchronization addition and averaging process and the FFT process in steps S103 and S104 and the DFT process in step S105 performed in parallel.

In step S103, the pickup signal (pickup response signal) buffered on the DFT processor 24 in step S102 is synchronization added by a unit of $2^n$ samples. The synchronization addition and averaging process by a unit of $2^n$ samples is performed by $2^d$ times.

The buffering area for the pickup signal for the synchronization addition and averaging process is reserved in the memory 42.

In step S105, the FFT is performed on the addition/averaging results. More specifically, the FFT is performed on the synchronization addition and averaging results of $2^n$ samples stored on the memory 42 in step S104 by a unit of $2^n$ samples. The frequency analysis results of the response signal component of the period signal of $2^n$ samples serving a base of the measurement signal are thus obtained. In other words, the frequency analysis results of only the sinusoidal wave component having the wave count of other than an integer multiple of $2^d$ within the measurement signal are obtained.

In step S105, the DFT starts with the head of the pickup signal at the index of other than the integer multiple of $2^d$ within the resolution increased band. More specifically, the DFT is performed on the pickup signal buffered on the memory 42 in the sound pickup process in step S102 and the sine signal and cosine signal corresponding to the sinusoidal waves synthesized into the measurement signal.

As previously discussed, the DFT calculation pointer is cycled through the pickup signal from the head thereof to the Nd-th sample ($2^{n+d}$-th sample) thereof so that the multiplication and summation operation is performed on the pickup signal and the sine data and the cosine data of each sinusoidal wave component by a predetermined number of times. The summation results of each sinusoidal wave are divided by the number of additions for averaging. The frequency-amplitude value for each synthesized sinusoidal wave (the frequency analysis results of only the sinusoidal wave component) is thus obtained.

The sine data and cosine data may be generated using the sin function (table) on the memory 42 used in step S101. A memory area for summation for the DFT process is also reserved in the memory 42.

In step S106, the FFT results obtained in step S104 and the DFT results obtained in step S105 are synthesized. In this way, in a predetermined resolution increased band, the index portion of an index, of other than the integer multiple of $2^d$, between the indexes of the integer multiple of $2^d$ obtained from the FFT results is filled. The frequency resolution is thus increased.

In step S107, an amplitude value correction process is performed. The amplitude value correction process is performed so that each amplitude value to frequency of the frequency analysis results obtained in the synthesis process in step S106 has flat characteristics.

In step S108, various analysis processes are performed. Based on the frequency analysis results subsequent to the amplitude value correction process, the frequency-amplitude characteristics analysis, gain analysis and low-frequency fine analysis are performed.

When the impulse response is acquired from the pickup response signal, an impulse calculation process (not shown in FIG. 15) is added by calculating the inverted period signal data 26*b* stored on the memory 42 of FIG. 14 and one of the synchronization addition and averaging results in step S103 and the FFT results in step S104. More specifically, the synchronization addition and averaging results (or the FFT results) are multiplied by the inverted period signal data 26*b* in the frequency domain and the resulting product is subjected to the IFFT process.

A second embodiment of the present invention is described below.

In accordance with the first embodiment, the required memory capacity and calculation amount are reduced by performing the DFT process on the pickup signal when the analysis results are obtained from only the sinusoidal wave component synthesized in order to increase frequency resolution. In the second embodiment of the present invention, a decimation and addition/averaging process is performed on the pickup signal and the FFT process is performed on the decimation and addition averaging results. The required memory capacity and calculation amount are thus reduced.

Figure 16:
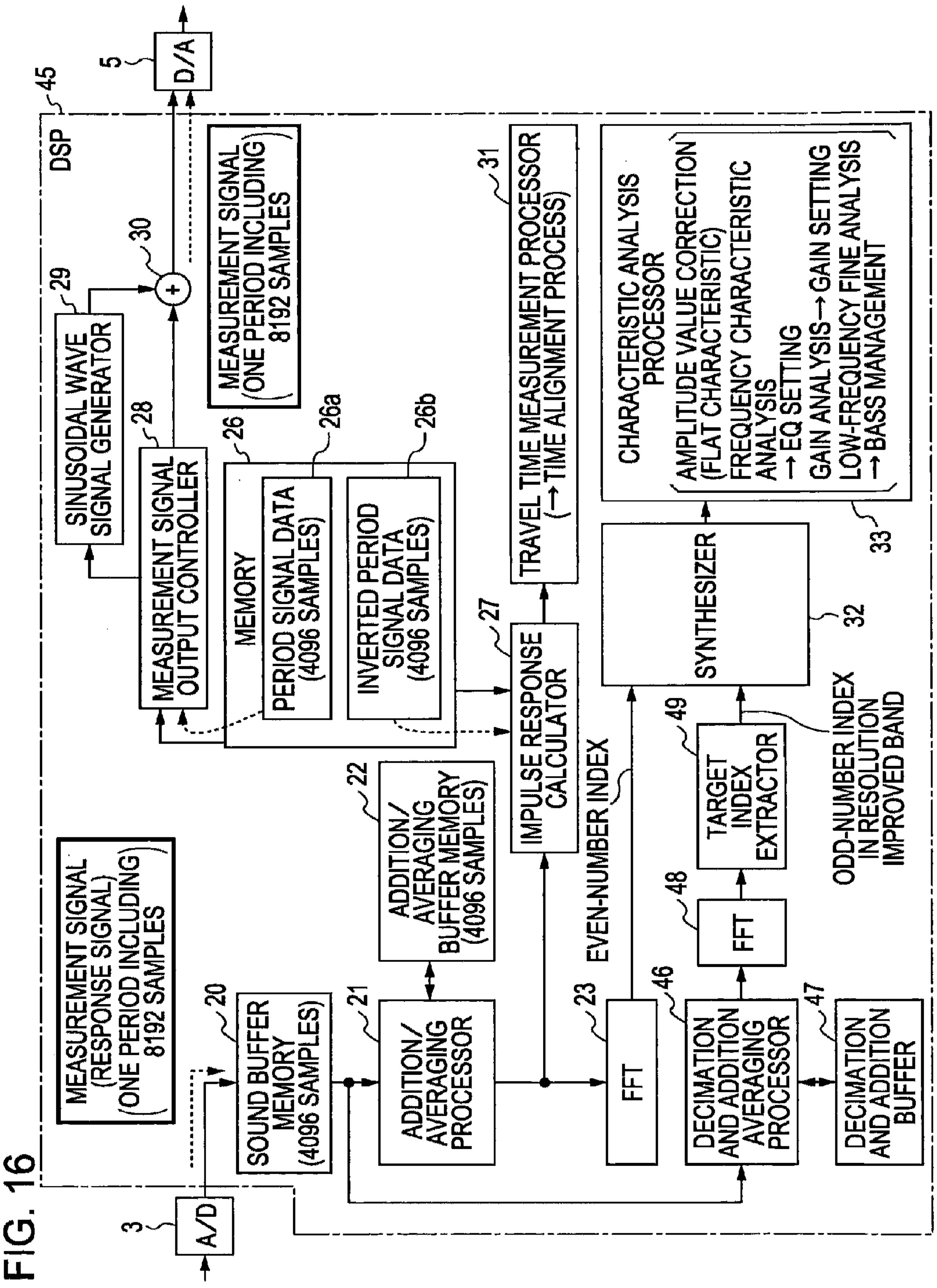
FIG. 16 is a block diagram illustrating a signal processing apparatus in accordance with a second embodiment of the present invention.

FIG. 16 illustrates the internal structure of the DSP 45 in the AV amplifier 1 of the second embodiment of the present invention. In FIG. 16, elements identical to those described with reference to the first embodiment (FIGS. 2 and 9) are designated with the same reference numerals and the discussion thereof is omitted herein.

The DSP 45 of the second embodiment does not include the DFT processor 24 and the accumulating memory 25 used in the DSP 4 but includes a decimation and addition/averaging processor 46, a decimation and addition buffer 47, an FFT processor 48 and a target index extractor 49.

The decimation and addition/averaging processor 46 performs a decimation and addition/averaging process on the pickup signal from the sound buffer memory 20 using the decimation and addition buffer 47.

Figure 17A:
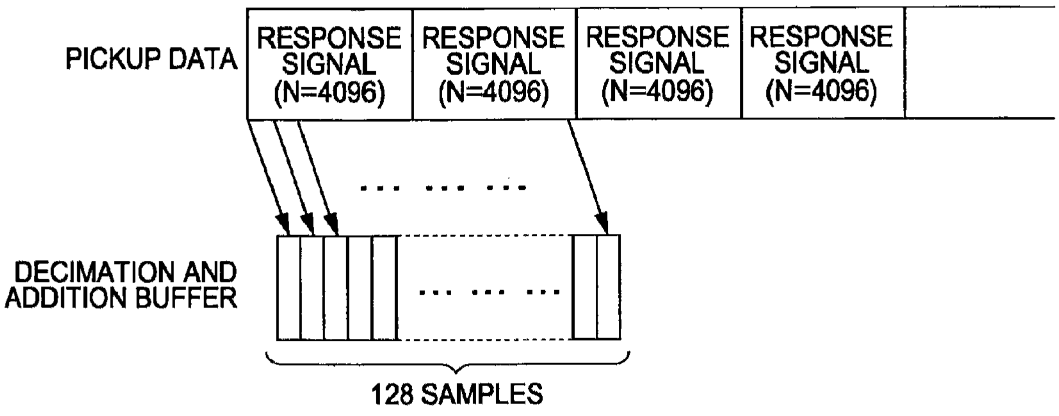
FIGS. 17A and 17B illustrate a decimation and addition/averaging process to be performed in the measurement operation in accordance with the second embodiment of the present invention.
Figure 17B:
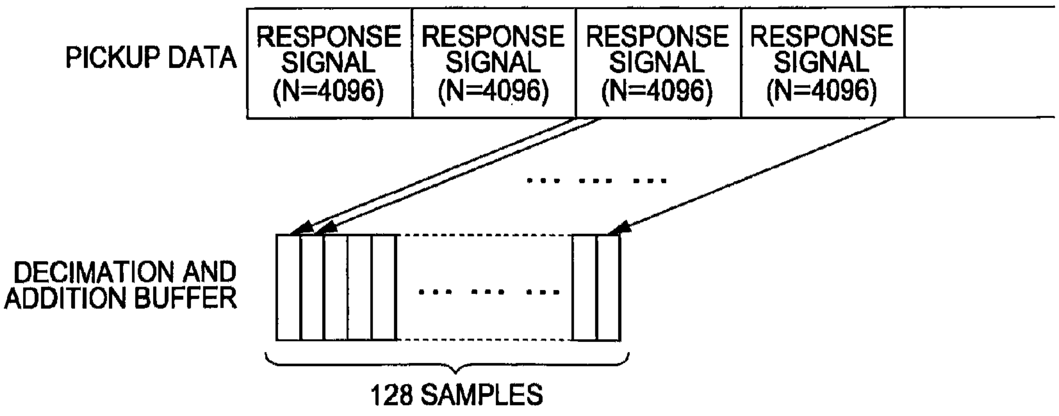

FIGS. 17A and 17B illustrate the decimation and addition/averaging process performed by the decimation and addition/averaging processor 46. The upper portion of each of FIGS. 17A and 17B illustrates the pickup data successively obtained on the sound buffer memory 20 by a unit of $2^n$ samples in the time domain and the lower portion of each of FIGS. 17A and 17B illustrates a buffering operation onto the decimation and addition buffer 47.

In FIGS. 17A and 17B, n=12 and d=1 (N=4096 and Nd=8192) are assumed.

A decimation rate is 1/64 (decimated one sample every 64 samples). The capacity of the decimation and addition buffer 47 is set for 128 samples. With the values set, one period of the measurement signal of 8192 samples (4096×2) fills the decimation and addition buffer 47 for 128 samples (8192/64=128) as shown in FIG. 17A.

Likewise, the decimation process is performed in subsequent periods of the measurement signal as shown in FIG. 17B. The decimation results are stored onto the decimation and addition buffer 47. More specifically, a value of a first sample is added to the value of the first sample stored on the decimation and addition buffer 47, a value of a second sample is added to the value of the second sample stored on the decimation and addition buffer 47 and so on. In this way, sample values at the same decimation position on the periods of the measurement signal are added to each other.

The decimation and addition/averaging process is performed by a predetermined number of times. Each of the 128 samples obtained on the decimation and addition buffer 47 is divided by the number of additions for averaging.

With n=12 and d=1, the pickup operation is performed on a per unit of 8192 samples basis by five times. The decimation and addition/averaging process is also performed by five times.

Returning to FIG. 16, the decimation and addition averaging results provided by the decimation and addition/averaging processor 46 are supplied to the FFT processor 48 for the FFT process.

Figure 18:
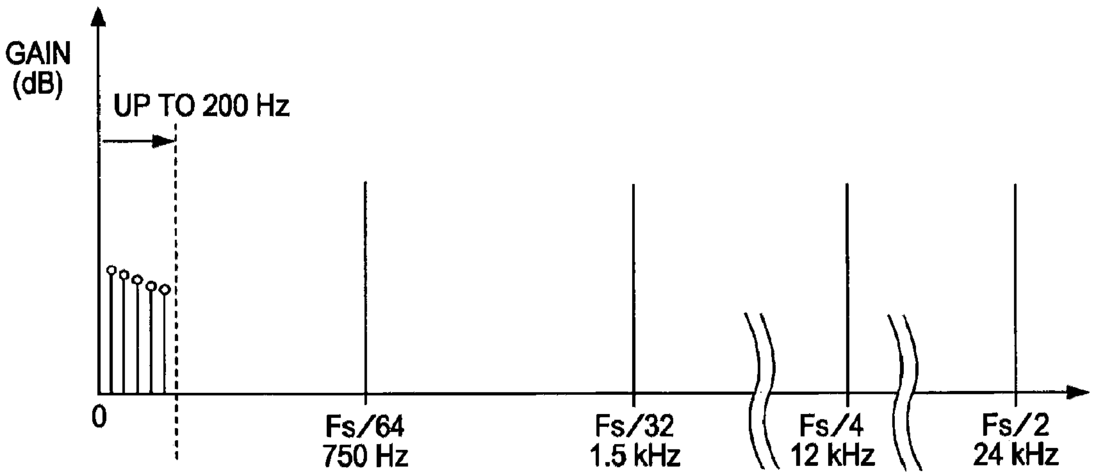
FIG. 18 illustrates a result of a fast Fourier transform (FFT) performed on the decimation and addition/averaging results.

FIG. 18 illustrates the frequency analysis results obtained from performing the FFT process on the decimation and addition averaging results.

If the FFT process is performed on the decimation and addition averaging results as shown in FIG. 18, the amplitude value is obtained within a range to a frequency responsive to the decimation ratio. Without the decimation process, the amplitude value should be obtained within a range to Fs/2 (Hz). More specifically, with a decimation ratio 1/64 and Nd=8192, an effective index is to (Fs/2)/64=375 Hz (Fs=48 kHz).

The band in need of measurement in the bass management system ranges to a border frequency with the sub woofer, namely about 200 Hz. It is sufficient if analysis results of 375 Hz is obtained from the decimation process with a decimation ratio of 1/64 performed on Fs=48 kHz.

As shown in FIG. 16, the target index extractor 49 receives from the FFT processor 48 the frequency analysis results having amplitude values in only a low-frequency region. The target index extractor 49 extracts only the amplitude value of the index of other than the integer multiple of $2^d$ within the predetermined resolution increased band. The extracted amplitude value of the index of other than the integer multiple of $2^d$ is then supplied to the synthesizer 32.

The synthesizer 32 synthesizes the amplitude value of the index of the integer multiple of $2^d$ obtained in the FFT processor 23 and the amplitude value of the index of other than the integer multiple of $2^d$ within the predetermined resolution increased band. This forms the resolution increased band.

In accordance with the technique of the second embodiment, an increase in the memory capacity required to increase frequency resolution is 128 samples in the decimation and addition buffer 47 with Nd=8192.

An increase in the amount of calculation for increasing frequency resolution is limited to an amount of calculation for acquiring the decimation and addition averaging results and an amount of calculation for the FFT processor 48. Since the FFT processor 48 performs the FFT process on the pickup signal that has been reduced in the decimation process, the amount of calculation is substantially reduced. The increase in the amount of calculation is far smaller than the amount of calculation required when the frequency analysis results of the synchronized sinusoidal wave are obtained by performing the FFT process on the measurement signal by a unit of the number of samples Nd.

In accordance with the technique of the second embodiment, the upper frequency limit observable in the analysis results of the FFT processor 48 is determined by setting the decimation rate on the decimation and addition/averaging processor 46. In the above-referenced case, Nd=8192 with n=12 and d=1. If the decimation rate is set to be 1/64 with d>1, the upper frequency limit observable in the analysis results is 375 Hz.

In accordance with the technique of the second embodiment, the decimation rate in the decimation and addition/averaging processor 46 is determined so that the amplitude value within the predetermined resolution increased band is obtained in the analysis results of the FFT processor 48. With the decimation rate determined in response to the resolution increased band, the memory capacity required for the decimation and addition/averaging process is automatically determined based on the value of the sample count Nd of the measurement signal. In accordance with the memory capacity, the capacity of the decimation and addition buffer 47 is determined.

If the sample count Nd ($=2^{n+d}$) of the measurement signal increases (to provide a high frequency resolution with the value of d increased), the memory capacity of the decimation and addition buffer 47 increases, and the amount of calculation of the FFT processor 48 also tends to increase. However, the increase in the memory capacity is far smaller than the memory capacity involved when the frequency analysis results of only the sinusoidal wave are obtained by performing the FFT process on the pickup signal of the measurement signal of Nd samples.

The decimation process is generally known as the term downsampling. When the downsampling process is performed, a low-pass filter (LPF) is used to control folding noise. The technique of the second embodiment eliminates the need for the low-pass filter.

The second embodiment of the present invention is intended to increase the frequency resolution in the low-frequency region. To this end, a relatively high value such as 1/64 is set for the decimation rate (downsampling rate). As shown in FIG. 18, no data is present in the decimation and addition averaging component except in the low-frequency region (up to frequency upper limit 200 Hz). The folding noise from a frequency higher than the frequency upper limit does not exist theoretically except at an index of $N=2^n$.

If noise generated in the measurement space is high enough to affect measurement values, the decimation and addition/averaging process may be performed subsequent to the band limiting process using the LPF on the pickup data.

In accordance with the second embodiment, the measurement operation may be performed using software in the same manner as in the first embodiment.

If the measurement operation is performed using software in the second embodiment, the same configuration as the one of FIG. 14 may be used and the discussion thereof is omitted herein. However, the measurement program 42*a* is the one for causing the DSP core 41 to perform the measurement operation of the second embodiment.

Figure 19:
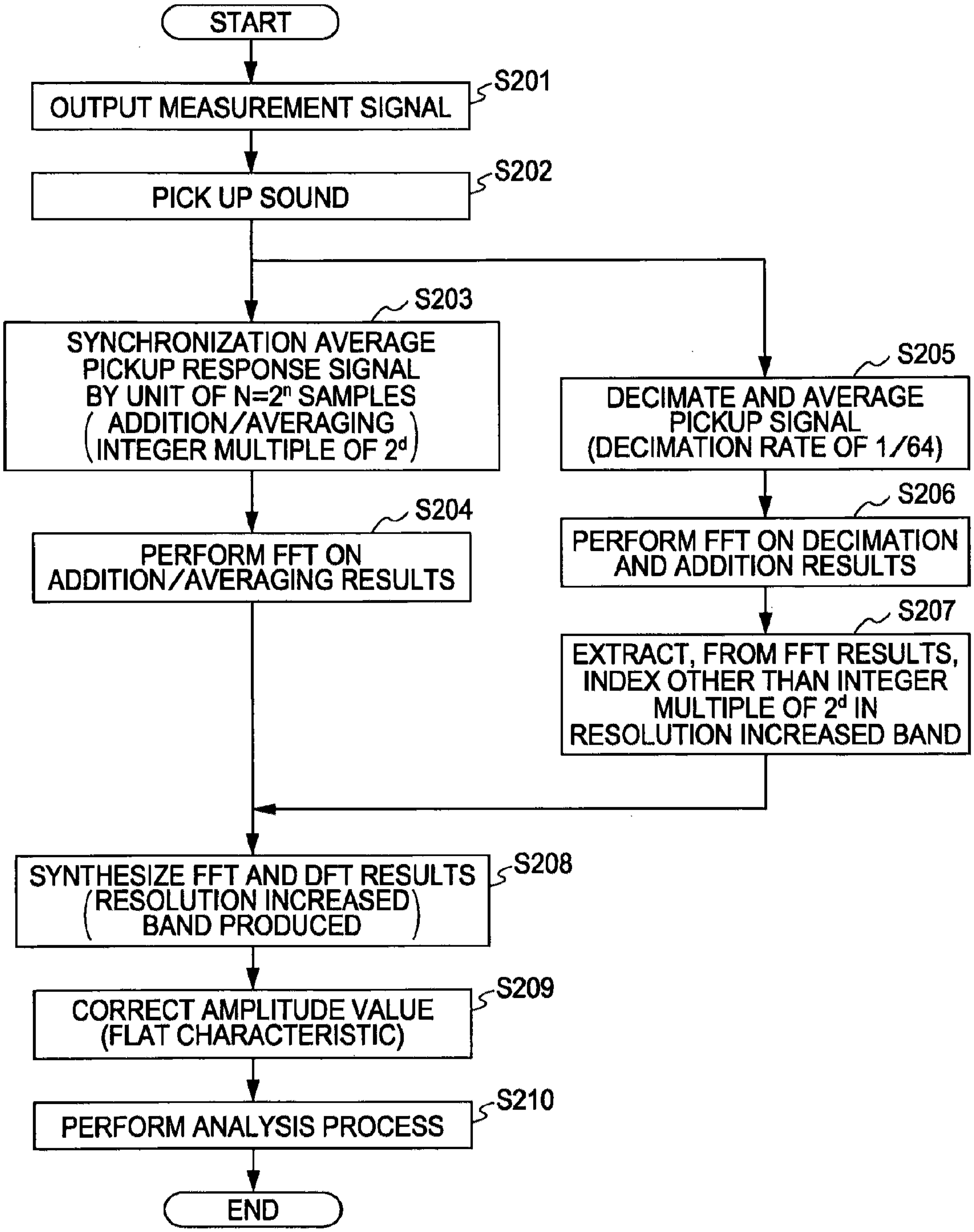
FIG. 19 is a flowchart illustrating a process to be performed to execute the measurement operation in accordance with the second embodiment of the present invention.
Figure 20:
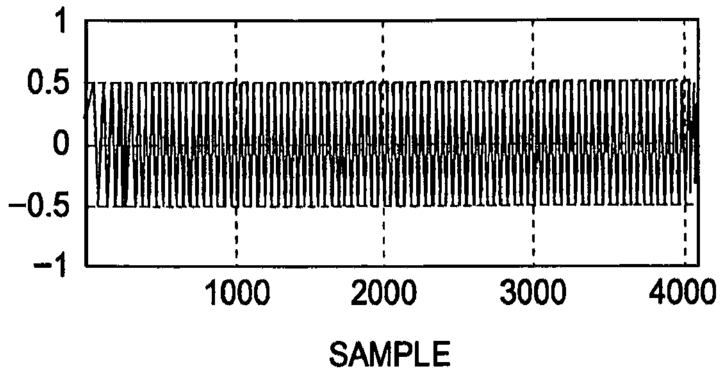
FIG. 20 illustrates an example of the TSP signal.
Figure 21:
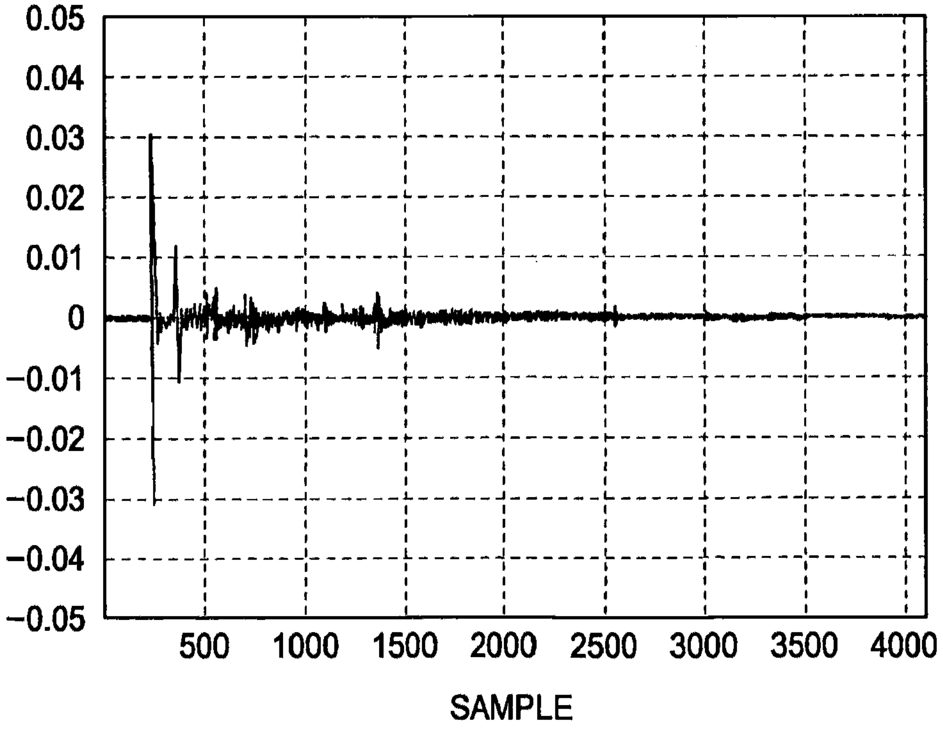
FIG. 21 illustrates an impulse response with the TSP signal being a measurement signal.

FIG. 19 is a flowchart illustrating the measurement operation of the second embodiment performed by the DSP core 41 in accordance with the measurement program 42*a*.

A measurement signal output process in step S201 and a pickup process in step S202 are respectively identical to step S101 and step S102 of FIG. 15.

The pickup process in step S202 is followed by a process for obtaining frequency analysis results of the response signal component of the original period signal of $2^n$ samples in steps S203 and S204 and a process for obtaining frequency analysis results of the synthesized sinusoidal wave in steps S205, S206 and S207, both processes being performed in parallel. Steps S203 and S204 are respectively identical to steps S103 and S104, and the discussion thereof is omitted herein.

In step S205, the decimation and addition/averaging process is performed on the pickup signal obtained in step S202. More specifically, the pickup signal is decimated every period on predetermined decimation and addition averaging results (for example, 1/64) and decimation results are synchronization added on the memory 42. The synchronization addition is performed by a predetermined number of times and the results are divided by the number of additions for averaging.

In step S206, the FFT process is performed on the decimation and addition averaging results obtained in step S205. In step S207, the amplitude value of the index of other than the integer multiple of $2^d$ within the resolution increased band is extracted from the FFT results obtained in step S206.

Steps S208, S209 and S210 are respectively identical to steps S106, S107 and S108. More specifically, in step S208, the FFT results obtained in step S204 and the index extraction results (amplitude value extraction results) obtained in step S207 are synthesized. A resolution increased band is thus constructed.

In step S209, the amplitude value correction process is performed on the frequency analysis results synthesized in step S208. In step S210, the frequency-amplitude characteristics analysis, gain analysis and low-frequency fine analysis are performed based on the amplitude value correction results obtained in step S209.

The embodiments of the present invention have been discussed and the present invention is not limited the above-described embodiments.

The AV amplifier 1 supports the 5.1 ch surround system in the above discussion. For example, the AV amplifier 1 may support any of stereophonic systems including other surround systems such as 7.1 ch and 2.1 ch and L/R 2 ch stereophonic system. Even in such a system, the measurement operation remains unchanged, i.e., the measurement signal from each loudspeaker is picked up and the pickup results are analyzed.

In the above discussion, the signal processing apparatus of the embodiments of the present invention is applied to the AV amplifier 1. Alternatively, the signal processing apparatus may be applied to another electronics.

In the above discussion, the period signal of $2^n$ samples serves as a base to generate the measurement signal. As the TSP signal in the related art, the base signal containing the signal ranging from 0 Hz to Fs/2 Hz at the same gain level in steps of Fs/N Hz is used. Let "N" represent the number of samples and "Fs" represent the sampling frequency. The predetermined phase rotation and volume increasing process is performed on the base signal. Alternatively, a pseudo-random signal having $2^n$ samples as one period may be used. In such a case, there are times when the impulse response cannot be determined from the pickup results of the measurement signal. The frequency resolution can be still increased by performing the frequency analysis in the same manner as in the measurement operation discussed above. More specifically, if only the increasing of the frequency resolution is important in the frequency analysis results, the period signal is merely the one having $2^n$ samples.

When both the increasing of the frequency resolution in the frequency analysis results and the acquisition of the impulse response are concurrently achieved based on the same measurement signal as described in the above-referenced embodiments, a signal satisfying the condition that a signal ranging from 0 Hz to Fs/2 Hz be contained in steps of Fs/N Hz over a period signal having $2^n$ samples is used.

The frequency analysis on the synchronization addition and averaging results of the pickup signal (frequency analysis on only the response signal component of the period signal of $2^n$ samples) is performed using the FFT process. Alternatively, another frequency analysis technique such as the DFT process may be used.

In accordance with the second embodiment, the FFT process is performed on the decimation and addition averaging results for frequency analysis. Alternatively, another frequency analysis technique such as the DFT process may be used.

When the low-frequency fine analysis is performed based on the analysis results of the frequency-amplitude characteristics resulting from the measurement operation, the amplitude values of all indexes within the resolution increased band are used. Only a part of the indexes within the resolution increased band may be used for low-frequency fine analysis. For example, only an amplitude value of an index serving as a delimiter of an octave unit or only an amplitude value of an index closest to a frequency of a delimitation of the octave unit may be used.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus, comprising:

signal output means for outputting a measurement signal, the measurement signal being produced by synthesizing a signal composed of a concatenation of $2^d$ period signals with a sinusoidal wave signal, each period signal having a time-domain waveform period being $2^n$ samples, the sinusoidal wave signal having a wave count within a concatenation period of $2^d$ period signals being other than an integer multiple of $2^d$, and n and d being natural numbers; and analyzing means for frequency analyzing a response signal obtained as a result of picking up the measurement signal output from the signal output means.

2. The signal processing apparatus according to claim 1, wherein the analyzing means synthesizes a first frequency analysis result obtained from frequency analyzing only a component of the period signal of $2^n$ samples with a second frequency analysis result obtained from frequency analyzing only a component of the sinusoidal signal synthesized and obtains frequency analysis results of the measurement signal.

3. The signal processing apparatus according to claim 2, wherein the analyzing means obtains the first frequency analysis result from a result of a synchronization addition/averaging by an integer multiple of $2^d$ times the response signal of the measurement signal on a per unit of $2^n$ samples basis and performing one of fast Fourier transform (FFT) and discrete Fourier transform (DFT) on the synchronization addition/average results, and obtains the second frequency analysis result by multiplying sine data and cosine data corresponding to the synthesized sinusoidal wave by the response signal of the measurement signal and summing resulting products.

4. The signal processing apparatus according to claim 2, wherein the analyzing means obtains the first frequency analysis result by synchronization addition/averaging by the integer multiple of $2^d$ times the response signal of the measurement signal on a per unit of $2^n$ samples basis and performing one of fast Fourier transform (FFT) and discrete Fourier transform (DFT) on a synchronization addition/average results, and obtains the second frequency analysis result by performing one of FFT and DFT on a result obtained from downsampling the response signal of the measurement signal.

5. The signal processing apparatus according to claim 1, wherein the signal output means continuously outputs prestored period signals of $2^n$ samples, outputs the sinusoidal wave signal generated based on a sine function and synthesizes the period signals and the sinusoidal wave signal on a real time basis.

6. The signal processing apparatus according to claim 1, wherein the measurement signal has a gain increased within a predetermined frequency band.

7. The signal processing apparatus according to claim 1, wherein each period signal is generated based on a signal containing a signal ranging from 0 Hz to Fs/2 Hz in steps of Fs/N Hz, N representing the number of samples of the period signal and Fs representing a sampling frequency, and wherein the analyzing means calculates an impulse response by synchronization addition/averaging by the integer multiple of $2^d$ times the response signal of the measurement signal on a per unit of $2^n$ samples basis and performing a calculation process on synchronization addition/averaging results and an inverted signal of the period signal.

8. A signal processing method carried out by a device, comprising steps of:

outputting a measurement signal, the measurement signal being produced by synthesizing a signal composed of a concatenation of $2^d$ period signals with a sinusoidal wave signal, each period signal having a time-domain waveform period being $2^n$ samples, the sinusoidal wave signal having a wave count within a concatenation period of $2^d$ period signals being other than an integer multiple of $2^d$, and n and d being natural numbers; and frequency analyzing a response signal obtained as a result of picking up the output measurement signal.

9. A non-transitory computer readable medium on which is stored a program for causing a computer to perform a signal processing method, comprising steps of:

outputting a measurement signal, the measurement signal being produced by synthesizing a signal composed of a concatenation of $2^d$ period signals with a sinusoidal wave signal, each period signal having a time-domain waveform period being $2^n$ samples, the sinusoidal wave signal having a wave count within a concatenation period of $2^d$ period signals being other than an integer multiple of $2^d$, and n and d being natural numbers; and frequency analyzing a response signal obtained as a result of picking up the output measurement signal.

10. A method of generating a signal carried out by a device, comprising a step of generating a measurement signal, the measurement signal being produced by synthesizing a signal composed of a concatenation of $2^d$ period signals with a sinusoidal wave signal, each period signal having a time-domain waveform period being $2^n$ samples, the sinusoidal wave signal having a wave count within a concatenation period of $2^d$ period signals being other than an integer multiple of $2^d$, and n and d being natural numbers.

11. A signal processing apparatus, comprising:

a signal output unit outputting a measurement signal, the measurement signal being produced by synthesizing a signal composed of a concatenation of $2^d$ period signals with a sinusoidal wave signal, each period signal having a time-domain waveform period being $2^n$ samples, the sinusoidal wave signal having a wave count within a concatenation period of $2^d$ period signals being other than an integer multiple of $2^d$, and n and d being natural numbers; and an analyzing unit frequency analyzing a response signal obtained as a result of picking up the measurement signal output from the signal output unit.

* * * * *